(12) United States Patent
Kinoshita

(10) Patent No.: US 6,945,246 B2
(45) Date of Patent: Sep. 20, 2005

(54) SOLAR RADIATION REFLECTOR AND SOLAR ENERGY SYSTEM COMPRISING THE SOLAR RADIATION REFLECTOR

(76) Inventor: Mikio Kinoshita, 740-23-402, Kudencho, Sakae-ku, Yokohama, Kanagawa (JP), 247-0014

( * ) Notice: Subject to any disclaimer, the term of this patent is extended or adjusted under 35 U.S.C. 154(b) by 0 days.

(21) Appl. No.: 10/312,314

(22) PCT Filed: Feb. 9, 2001

(86) PCT No.: PCT/JP01/00907

§ 371 (c)(1),
(2), (4) Date: Dec. 22, 2002

(87) PCT Pub. No.: WO02/01117

PCT Pub. Date: Jan. 3, 2002

(65) Prior Publication Data

US 2003/0136397 A1 Jul. 24, 2003

(30) Foreign Application Priority Data

Jun. 26, 2000 (JP) .................................. PCT/JP00/04181

(51) Int. Cl.[7] .................................................. F24J 2/10
(52) U.S. Cl. ...................................... 126/605; 126/688
(58) Field of Search ................................ 126/576, 577, 126/605–607, 648, 649, 688; 395/853; 136/246

(56) References Cited

U.S. PATENT DOCUMENTS 4,056,313 A * 11/1977 Arbogast .................... 359/853
4,102,326 A * 7/1978 Sommer ..................... 359/853
4,110,010 A * 8/1978 Hilton ........................ 359/853
4,198,826 A * 4/1980 Chromie ..................... 126/688
4,922,088 A   5/1990 Kasuya
5,542,409 A * 8/1996 Sampayo .................... 126/606
5,787,878 A * 8/1998 Ratliff, Jr. .................. 126/605

FOREIGN PATENT DOCUMENTS

| JP | S51-27347 | 6/1976 |
| JP | S60-243444 | 12/1985 |
| JP | S63-2202 | 1/1988 |
| JP | H11-281167 | 10/1999 |

* cited by examiner

Primary Examiner—Sara Clarke

(57) ABSTRACT

A solar radiation reflector comprising a plurality of arms arranged in parallel, a plurality of driver mechanisms driven, respectively, by the arms, a plurality of reflectors turned, respectively, by the driven mechanisms, a plurality of reflection direction designating members connected, respectively, with the driven mechanisms to designate a predetermined direction of reflection of reflectors, respectively, a common link for turning the arms simultaneously, and a drive mechanism for driving the common link to direct the arms in parallel with the incident direction of solar radiation, and a solar energy system comprising the solar radiation reflector and a solar energy converter. The driven mechanisms driven simultaneously by the driving mechanism through the common link and the arms so that the reflectors may reflect solar radiation, respectively, toward specified directions turn the reflectors, respectively.

25 Claims, 22 Drawing Sheets

SOLAR RADIATION REFLECTOR AND SOLAR ENERGY SYSTEM COMPRISING THE SOLAR RADIATION REFLECTOR

TECHNICAL FIELD

The present invention relates to a solar radiation reflecting apparatus and a solar energy system having the solar radiation reflecting apparatus, such as a solar heat system, a solar furnace, a solar heat power generation system, a photovoltaic power generation system, a distillation device, a solar illuminator, or a chemical reactor system, or the like.

BACKGROUND ART

As a background art utilizing energy of solar radiation, there is a photovoltaic power generation system, a solar heat system, a solar furnace, a distillation device such as a desalination system, a chemical reactor system, or a sunlight illuminating system, for example.

The energy density of solar radiation is about 1 KW/m$^2$. In operating these energy systems at a high energy density, concentration of solar radiation is performed. As a light convergence element for concentrating solar radiation, there is a Fresnel lens or a parabolic mirror, for example.

When solar radiation is concentrated on a solar energy conversion apparatus using a light convergence system having such a light convergence element, it is generally important to make an incident direction of solar radiation agree with an optical axis of the light convergence system for obtaining a high condensing ratio. Namely, solar radiation is utilized at a high condensing ratio in a solar energy system having a tracking mechanism which rotates the light convergence element in response to the variation of the incident direction of solar radiation, and which makes the solar energy conversion apparatus agree with the focal point of the light convergence element.

In order to operate such a solar energy system for a long period of time, durability against strong wind and so forth is requested. When the height of the light convergence element increases, the bad influence of the wind pressure increases remarkably. Therefore, when the light convergence element extending to a high altitude is utilized, the costs in maintaining the mechanical strength of the light convergence element and the tracking mechanism increase. Accordingly, the utilization of the large-scale light convergence element is limited to a certain extent.

Further, in irradiating a fixed region with solar radiation utilizing a plane mirror, there has been a similar problem in enlarging a tracking mechanism.

As another background art, an energy system that is called a heliostat is known. In general, the heliostat includes a plurality of plane mirrors and a plurality of tracking mechanisms which respectively drive the plurality of plane mirrors. A fixed irradiation region is irradiated with solar radiation reflected and concentrated by the plurality of plane mirrors. The heliostat which concentrates solar radiation at a high condensing ratio includes many high-precision tracking mechanisms. In this case, however, the cost of the tracking mechanisms is high, and the reduction thereof is requested.

As another background art on the heliostat, heliostatic light collector is disclosed in the Japanese Laid-Open Patent Publication No. 60-243444. The heliostatic light collector includes a mirror supporting bar, an expansion and contraction bar, and a sun directing bar. However, there has been the problem that solar radiation cannot be concentrated when the light convergence direction is equal to the direction of the sun.

Further, in the heliostat according to the above-mentioned background arts, when a large-scale plane mirror is used, there has been the bad influence due to the above-mentioned wind pressure or the problem due to the enlargement of the tracking mechanism.

As still another background art which is proposed, from such a the point of view, a sunlight convergence apparatus is disclosed in the Japanese Laid-Open Patent Publication No. 51-27347, which includes many small reflectors which can be rotated around respective specified shafts as the centers, a controlling body, and a common link which connects each small reflector to the controlling body. Each small mirror is rotated with the same angular variation by the movement of the controlling body. When the controlling body is in a specified position, each small reflector is at an angle so as to reflect and concentrate a parallel light beam at a specific incident angle toward a specified light-convergence position. The sunlight convergence apparatus is designed so as to concentrate the reflected light from each small mirror to the light-convergence position by controlling the position of the controlling body, in response to the variation of the incident angle of the parallel incident light beam.

In the sunlight convergence apparatus, however, there has been the problem that the condensing ratio is remarkably deteriorated with the increment of the variation of the incident angle of the incident light. However, such a decrease in the condensing ratio is not referred to in the Laid-Open Patent Publication No. 51-27347, and the teaching for overcoming this is not disclosed.

The present invention is made in view of the above, and an object of the present invention is to solve the above-mentioned problems.

Another object of the present invention is to provide a novel solar radiation reflecting apparatus which realizes a high condensing ratio for a wide range of incident angle of incident light, and which simultaneously drives a plurality of reflectors.

Still another object of the present invention is to provide a novel solar energy system which utilizes solar energy with a high condensing ratio.

Still another object of the present invention is to provide a novel solar energy system, in which solar radiation collecting efficiency is high.

Still another object of the present invention is to provide a novel solar energy system at a low-cost.

Still another object of the present invention is to improve the stability or the durability in the operation of the solar energy system against the external environment such as the wind or the sand and dust.

DISCLOSURE OF INVENTION

According to an embodiment of the present invention, a novel solar radiation reflecting apparatus is provided. The solar radiation reflecting apparatus includes a plurality of arms which are disposed parallel to each other, a plurality of driven mechanisms which are respectively driven by the plurality of arms, a plurality of reflectors which are respectively rotated by the plurality of driven mechanisms, a plurality of reflective direction directing members which are respectively connected to the plurality of driven mechanisms, a common link for simultaneously rotating the plurality of arms, and a driving mechanism for driving the common link so that the plurality of arms are caused to be parallel to an incident direction of solar radiation. The plurality of reflective direction directing members direct respective prescribed reflective directions for the plurality of reflectors. Namely, the plurality of driven mechanisms are simultaneously driven by the driving mechanism through the common link and the plurality of arms. The plurality of driven mechanisms respectively rotate the plurality of reflectors so that the plurality of reflectors reflect solar radiation toward the respective prescribed reflective directions.

At least one of the plurality of driven mechanisms may include a first guide member, a first sliding member which is mounted to the first guide member, a second guide member, a second sliding member which is mounted to the second guide member, a first connection member which connects the first sliding member to the corresponding reflective direction directing member, a second connection member which connects the first sliding member to the corresponding arm, a third connection member which connects the second sliding member to the reflective direction directing member, and a fourth connection member which connects the second sliding member to the arm. The corresponding reflector is disposed parallel to a plane including the first guide member and the second guide member.

At least one of the plurality of driven mechanisms may include a first driven unit having a first guide member, a second guide member, a first connection member, a second connection member, a first sliding member, a second sliding member, a first base, a second base, and a third base and a second driven unit having a third guide member, a fourth guide member, a third connection member, a fourth connection member, a third sliding member, a fourth sliding member, a fourth base, a fifth base, and a sixth base.

At least one of the plurality of driven mechanisms may include a sub bar which is disposed parallel to a reflective surface of the corresponding reflector, a first pivot axis providing member which is disposed between the sub bar and the corresponding arm, a second pivot axis providing member which is disposed between the sub bar and the corresponding reflective direction directing member, a guide member which is disposed parallel to the reflective surface, a sliding member which is mounted to the guide member, a first connection member which connects the reflective direction directing member to the sliding member, and a second connection member which connects the arm to the sliding member. When the arm becomes parallel to the reflective direction directing member, a rotational restitutive force may be applied for maintaining the reflective direction directing member at a prescribed angle.

At least one of the plurality of driven mechanisms may include a first sub bar which is disposed on a surface of the corresponding reflector and which is tightly connected to the corresponding arm, a second sub bar which is disposed parallel to the first sub bar on the rear surface of the reflector and which is tightly connected to the corresponding reflective direction directing member, a first pivot axis providing member which accommodates the first sub bar, a second pivot axis providing member which accommodates the second sub bar, a guide member which is tightly connected to the reflector, a sliding member which is mounted to the guide member, a first connection member which connects the reflective direction directing member to the sliding member, and a second connection member which connects the arm to the sliding member.

At least one of the plurality of the driven mechanisms may include a reflector vertical bar which is tightly connected to the corresponding reflector, a first pivot bar which is connected to the corresponding reflective direction directing member, a sliding member which is connected to the first pivot bar, and a second pivot bar which is connected to the sliding member and the arm.

At least one of the plurality of arms may be connected to the corresponding reflective direction directing member through a joint. The joint becomes a fulcrum for rotating the arm.

The driving mechanism may include a driving bar for driving the common link. Further, a handle for rotating the driving bar may be provided.

The driving mechanism may include a tracking mechanism. The tracking mechanism may include an optical sensor.

The solar radiation reflecting apparatus may further include a housing container for housing the plurality of reflectors, the plurality of driven mechanisms, the plurality of arms, and the common link. Liquid may be charged into the housing container.

Solar radiation reflected by the plurality of reflectors may be concentrated to a solar radiation collecting region. The solar radiation collecting region may be plural.

The solar radiation reflecting apparatus may further include an adjusting mechanism for adjusting the prescribed reflective direction.

At least one of the plurality of reflective direction directing members may be fixed by a fixing member including a pair of universal joints.

According to another embodiment of the present invention, a solar energy system is provided, which includes a solar energy conversion apparatus, a plurality of arms which are disposed parallel to each other, a plurality of driven mechanisms which are respectively driven by the plurality of arms, a plurality of reflectors which are respectively rotated by the plurality of driven mechanisms, a plurality of reflective direction directing members which indicate respective prescribed reflective directions for the plurality of reflectors, and which are respectively connected to the plurality of driven mechanisms, a common link for simultaneously rotating the plurality of arms, and a driving mechanism for driving the common link so that the plurality of arms are caused to be parallel to an incident direction of solar radiation. The plurality of driven mechanisms which are simultaneously driven by the driving mechanism through the common link and the plurality of arms rotate the plurality of reflectors, respectively, so that the plurality of reflectors reflect solar radiation toward the solar energy conversion apparatus.

The solar energy system may further include an adjusting mechanism for adjusting the prescribed reflective direction. In response to the variation of solar radiation intensity, a condensing ratio of solar radiation with which the solar energy conversion apparatus is irradiated may be changed.

According to still another embodiment of the present invention, a novel solar radiation reflecting apparatus is provided. The solar radiation reflecting apparatus includes a plurality of arms which are disposed parallel to each other, a plurality of reflectors, a plurality of reflective direction directing members which direct respective prescribed reflective directions for the plurality of reflectors, means for simultaneously driving the plurality of arms so that the plurality of arms are caused to be parallel to an incident direction of solar radiation, and means for simultaneously rotating the plurality of reflectors in accordance with respective positions of the plurality of reflective direction directing members and respective positions of the plurality of arms so that the plurality of reflectors reflect solar radiation toward respective prescribed reflective directions.

BEST MODE FOR CARRYING OUT THE INVENTION

Figure 1:
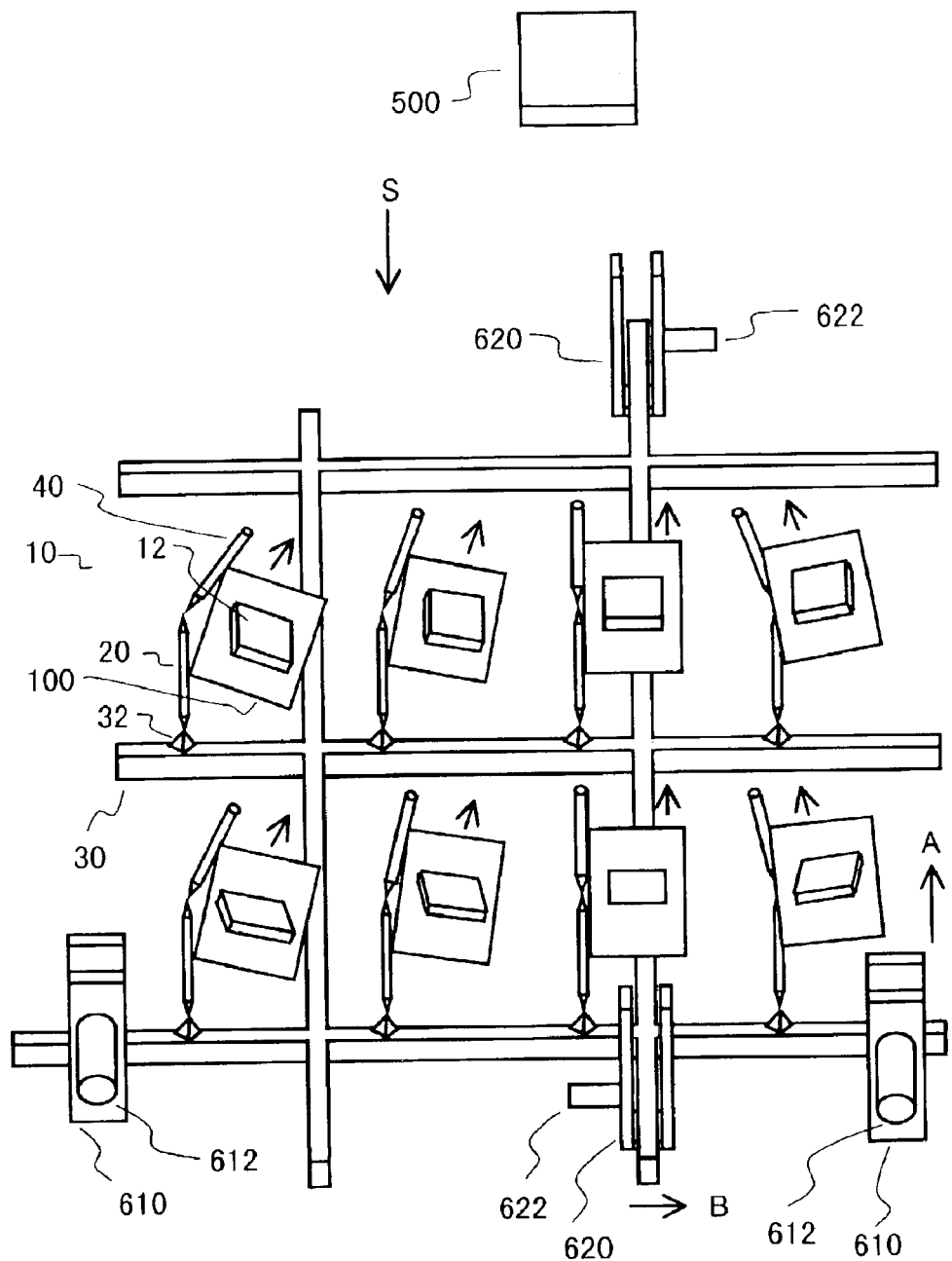
FIG. 1 is a conceptual view illustrating a solar radiation reflecting apparatus according to an embodiment of the present invention.

Referring to accompanying drawings, the present invention is explained for more detailed illustration. The same reference numeral designates the same or corresponding part throughout the several views.

FIG. 1 is a conceptual view illustrating a solar radiation reflecting apparatus according to an embodiment of the present invention. The solar radiation reflecting apparatus is explained referring to FIGS. 1–28.

In FIG. 1, the solar radiation reflecting apparatus includes a plurality of arms 20 which are disposed parallel to each other, a plurality of reflector units 10, a plurality of driven mechanisms 100 which are respectively driven by the plurality of arms 10, a plurality of reflectors 12 which are respectively rotated by the plurality of driven mechanisms, a plurality of reflective direction directing members 40 which are respectively connected to the plurality of driven mechanisms, a common link 30 for simultaneously rotating the plurality of arms 20, and a driving mechanism for driving the common link so that the plurality of arms 20 are caused to be parallel to an incident direction of solar radiation. The plurality of driven mechanisms 100 are respectively provided to the plurality of reflector units 10. Further, the plurality of reflectors 12 are respectively provided to the plurality of reflector units 10. The plurality of reflective direction directing members 40 direct respective prescribed reflective directions for the plurality of reflectors 12.

Each reflector 12 is a plane reflector. Alternatively, a convex mirror or a concave mirror may be used as the reflector 12.

The driving mechanism includes a pair of first driving members 610 and a pair of second driving members 620.

The plurality of reflector units 10 illustrated in FIG. 1 are arranged in a horizontal installation surface. Alternatively, the plurality of reflector units 10 may be arranged along a slope, a vertical surface, or a curved surface. Eight reflector units 10 are illustrated in FIG. 1. However, the number of the plurality of reflector units is optional. For example, 2-1000000 of reflector units may be arranged. Further, when the solar radiation reflecting apparatus includes many arms, the common link may be plural. The common link may include a truss structure (not shown).

A common link connection member 32 is provided between each arm 20 and the common link 30.

An arrow S designates an incident direction of solar radiation. The arrow S of FIG. 1 corresponds to solar radiation that is incident from the vertical direction. The plurality of arms 20 are disposed so as to be parallel to the incident direction of solar radiation. When the direction of solar radiation varies, the directions of the arms 20 are simultaneously changed.

Each first driving member 610 moves parallel to the direction indicated by an arrow A of FIG. 1. The arrow A designates one direction in the horizontal installation surface. Each first driving member 610 includes an ultrasonic vibrator 612 for reducing friction between the common link 30 and the first driving member 610.

Each second driving member 620 moves parallel to the direction indicated by an arrow B of FIG. 1. The arrow B designates the direction perpendicular to the arrow A in the horizontal installation surface. Each second driving member 620 includes an ultrasonic vibrator 622 for reducing friction between the common link 30 and the second driving member 620.

As mentioned above, each reflective direction directing member 40 directs the direction toward a solar energy conversion apparatus 500 installed above the solar radiation reflecting apparatus. Each reflective direction directing member 40 is fixed by a reflective direction directing member fixing member (not shown). The reflective direction directing member 40 supports the driven mechanism 100 and the arm 20.

Further, the common link 30 is supported by the plurality of arms 20.

As described in detail later, each driven mechanism 100 changes its shape in accordance with the position of the reflective direction directing member 40 and the position of the arm 20, and rotates the reflector 12 so that the reflector 12 reflects solar radiation in the direction directed by the reflective direction directing member 40. An arrow drawn above each reflector 12 directs the reflective direction of solar radiation. In FIG. 1, each driven mechanism 100 is drawn like a parallelogram, which is for a conceptual illustration of the change in shape of the driven mechanism 100, and which does not illustrate the actual structure of the driven mechanism 100.

The structure of each reflector unit 10 is explained, referring to FIGS. 2–14 and FIGS. 19–26.

Figure 2:
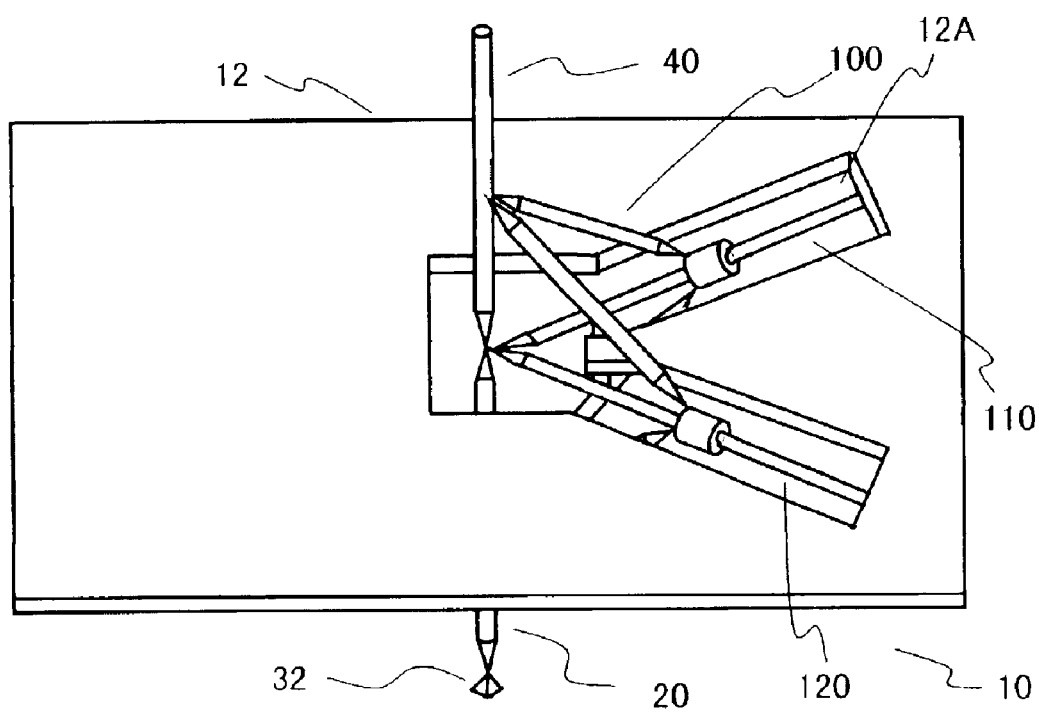
FIG. 2 is a schematic view illustrating an example of a reflector unit.
Figure 3:
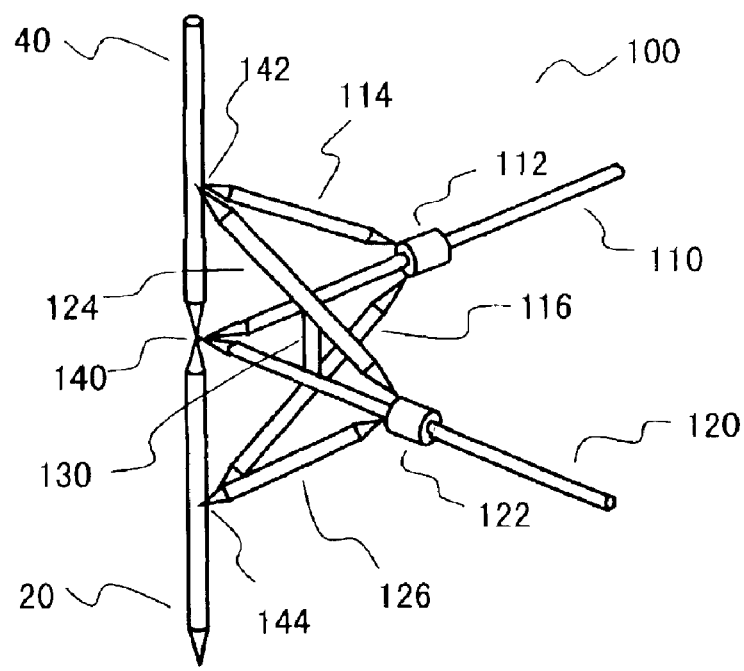
FIG. 3 is a schematic view illustrating an example of a structure of a structural body having an arm, a reflective direction directing member, and a driven mechanism.

FIG. 2 is a schematic view illustrating the reflector unit 10. FIG. 3 is a schematic view illustrating the structure of the structural body including the arm 20, the reflective direction directing member 40, and the driven mechanism 100.

In FIG. 3, the driven mechanism 100 includes a first guide member 110, a second guide member 120, a first sliding member 112, a second sliding member 122, a first connection member 114 which connects the reflective direction directing member 40 to the first sliding member 112, a second connection member 116 which connects the arm 20 to the first sliding member 112, a third connection member 124 which connects the reflective direction directing member 40 to the second sliding member 122, and a fourth connection member 126 which connects the arm 20 to the second sliding member 122. Further, an angle fixing member 130 for fixing the angle between the first guide member 110 and the second guide member 120 is provided to the driven mechanism 100.

The first guide member 110, the second guide member 120, the reflective direction directing member 40, and the arm 20 intersect at a first connection part 140.

The first connection member 114 and the third connection member 124 are connected to the reflective direction directing member 40 at a second connection part 142.

The second connection member 116 and the fourth connection member 126 are connected to the arm 20 at a third connection part 144.

In FIG. 2, the reflector 12 is disposed along the plane defined by the first guide member 110 and the second guide member 120. Namely, the reflector 12 is supported by the first guide member 110, the second guide member 120, and the fixing member 130 which are at the right side of FIG. 2. The reflector 12 may be fixed to the first guide member 110, the second guide member 120, and the angle fixing member 130 using a reflector fixing member (not shown) such as an adhesive tape. Alternatively, an additional mounting member (not shown) maybe connected to in the plane defined by the first guide member 110 and the second guide member 120. In this case, the additional mounting member extends to the left region of FIG. 2.

A hole 12A is bored through the reflector 12 in the region where the first sliding member 112 and the second sliding member 122 move.

Figure 4:
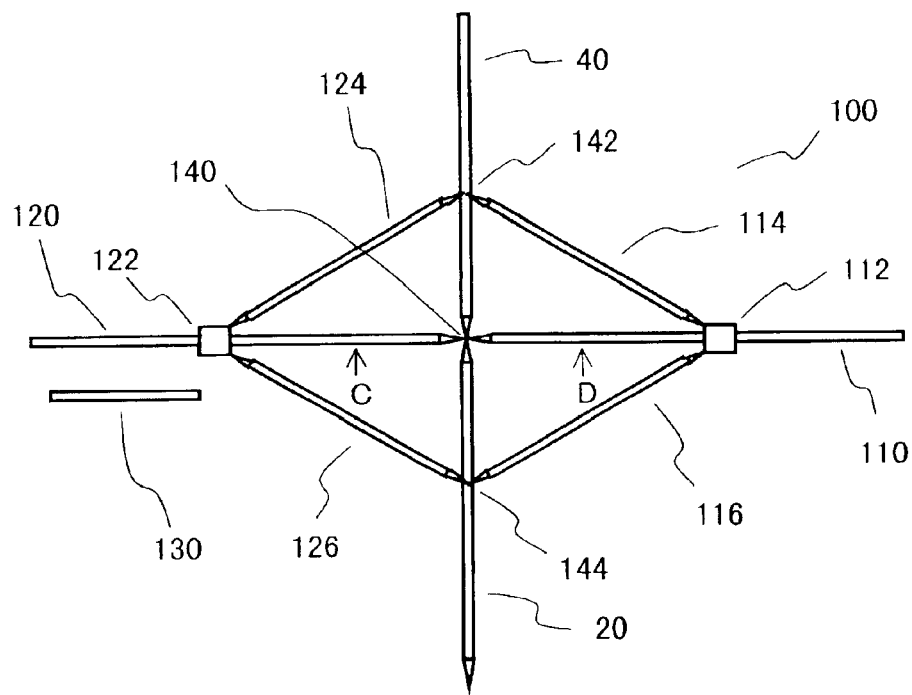
FIG. 4 is a developed drawing for the structural body having the arm, the reflective direction directing member, and the driven mechanism illustrated in FIG. 3.

FIG. 4 is a developed drawing of the structure including the arm 20, the reflective direction directing member 40, and the driven mechanism 100.

The length of the first connection member 114 is equal to the length of the second connection member 116.

The length of the third connection member 124 is equal to the length of the fourth connection member 126. Further, the length of the third connection member 124 is equal to the length of the first connection member 114. Alternatively, the length of the third connection member 124 maybe different from the length of the first connection member 114.

The distance between the first connection part 140 and the second connection part 142 is equal to the distance between the first connection part 140 and the third connection part 144.

Both of the edges of the angle fixing member 130 of FIG. 4 are connected to the places indicated by arrows C and D of FIG. 4, respectively.

Figure 5:
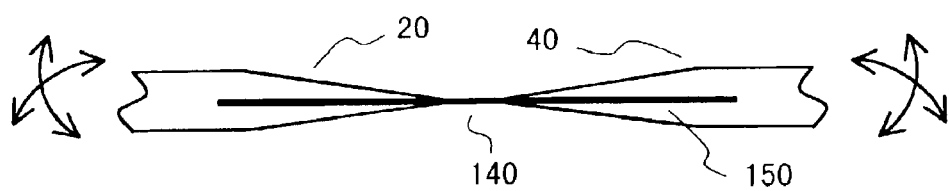
FIG. 5 is a schematic view illustrating an example of a structure of a connection part between the arm and the reflective direction directing member.

FIG. 5 is a schematic view illustrating an example of the structure of the first connection part 140 between the arm 20 and the reflective direction directing member 40. The arm 20 is connected to the reflective direction directing member 40 through a string 150. The string 150 is glued to the front edge of the arm 20 and the front edge of the reflective direction directing member 40. The arm 20 can be freely rotated in any direction. A pair of arrows of FIG. 5 is a symbol illustrating the connection state in which the free rotation in any direction is possible. Similarly, the reflective direction directing member 40 can be freely rotated in any direction. Hereinafter, such a general form of the connection in which the free rotation is possible is called a universal joint. Namely, the first connection part 140 corresponds to the universal joint.

Figure 6:
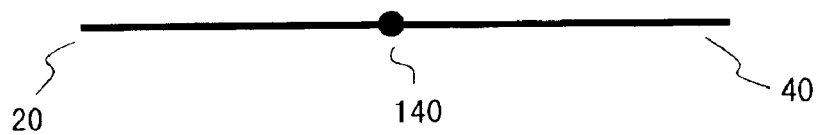
FIG. 6 illustrates a symbol designating the form of connection illustrated in FIG. 5.

FIG. 6 illustrates a symbol representing the connection form through the universal joint illustrated in FIG. 5. The black circle of FIG. 6 is the symbol representing that the first connection part 140 is a universal joint.

The first guide member 110 and the second guide member 120 are further connected to the first connection part 140.

Figure 7:
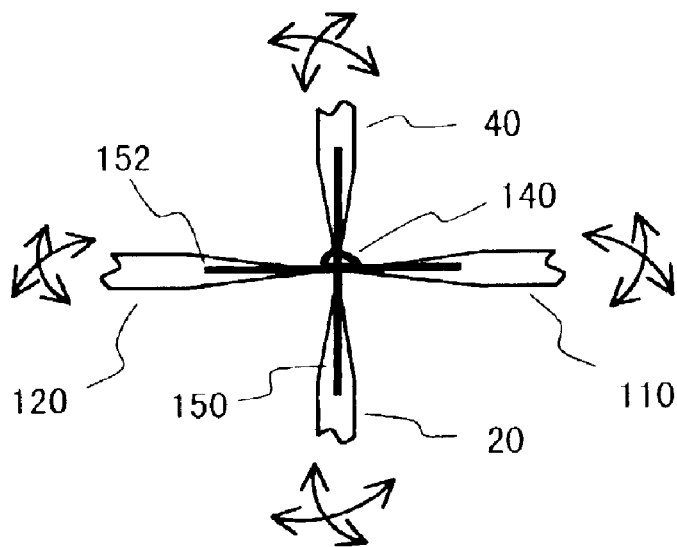
FIG. 7 is a schematic view illustrating an example of a connection among the arm, the reflective direction directing member, a first guide member, and a second guide member.

FIG. 7 is a schematic view illustrating an example of the connection among the arm 20, the reflective direction directing member 40, the first guide member 110, and the second guide member 120 at the first connection part 140. In FIG. 7, the front edge of the first guide member 110 and the front edge of the second guide member 120 are respectively glued to a string 152 which is wound around the string 150. The first connection part 140 does not limit respective rotations of the arm 20, the reflective direction directing member 40, the first guide member 110, and the second guide member 120. However, because the above-mentioned angle fixing member 130 exists between the first guide member 110 and the second guide member 120, the angle between the first guide member 110 and second guide member 120 is fixed at a prescribed angle. The prescribed angle maybe, for example, the right angle. The angle fixing member 130 maybe tightly fixed to the first guide member 110 and the second guide member 120. Alternatively, the joint part between the angle fixing member 130 and the first guide member 110 and the joint part between the angle fixing member 130 and the second guide member 120 may be universal joints.

Figure 8:
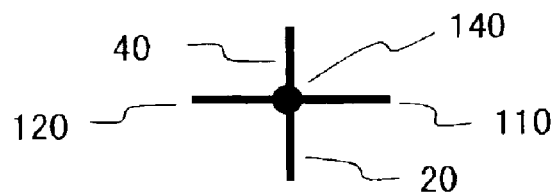
FIG. 8 illustrates a symbol designating the form of connection illustrated in FIG. 7.

FIG. 8 illustrates a symbol representing the connection form illustrated in FIG. 7.

Figure 9:
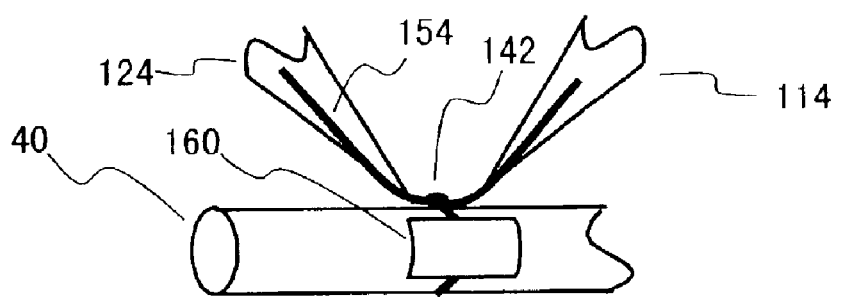
FIG. 9 is a schematic view illustrating an example of a connection among the reflective direction directing member, a first connection member, and a third connection member.

FIG. 9 is a schematic view illustrating an example of the structure of the second connection part 142. In FIG. 9, a string 154 is wound around the reflective direction directing member 40, and is fixed by an adhesive member 160. The front edge of the first connection member 114 and the front edge of the third connection member 124 are glued to the string 154. The second connection part 142 corresponds to a universal joint.

Figure 10:
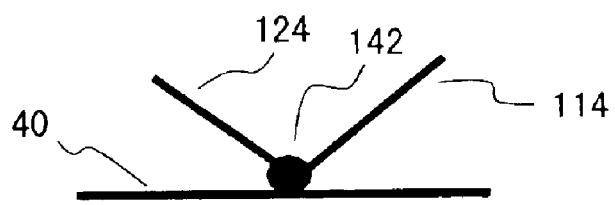
FIG. 10 illustrates a symbol designating the form of connection illustrated in FIG. 9.

FIG. 10 illustrates a symbol representing the connection form illustrated in FIG. 9.

The structure of the third connection part 144 includes a similar structure as the second connection part 142.

Figure 11:
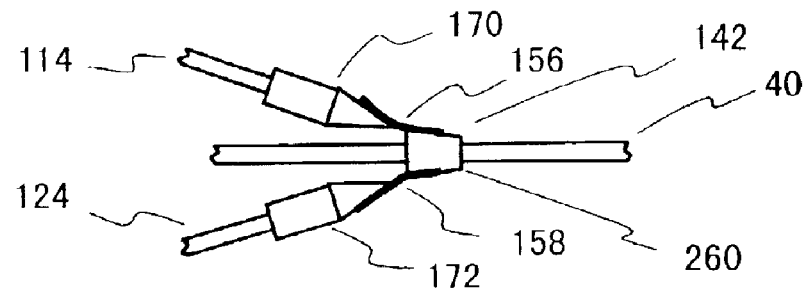
FIG. 11 is a schematic view illustrating another example of the connection among the reflective direction directing member, the first connection member, and the third connection member.

FIG. 11 is a schematic view illustrating another example of the structure of the second connection part 142. In FIG. 11, a sleeve 260 is mounted and fixed to the reflective direction directing member 40. A receiving component 170 is connected to the sleeve 260 through a member 156 having flexibility. The first connection member 114 is mounted to the receiving component 170. Further, a receiving component 172 is connected to the sleeve 260 through a member 158 having flexibility. The third connection member 124 is mounted to the receiving component 172. The sleeve 260, the receiving component 170, the receiving component 172, the member 156, and the member 158 may be an integrated plastic.

Figure 12:
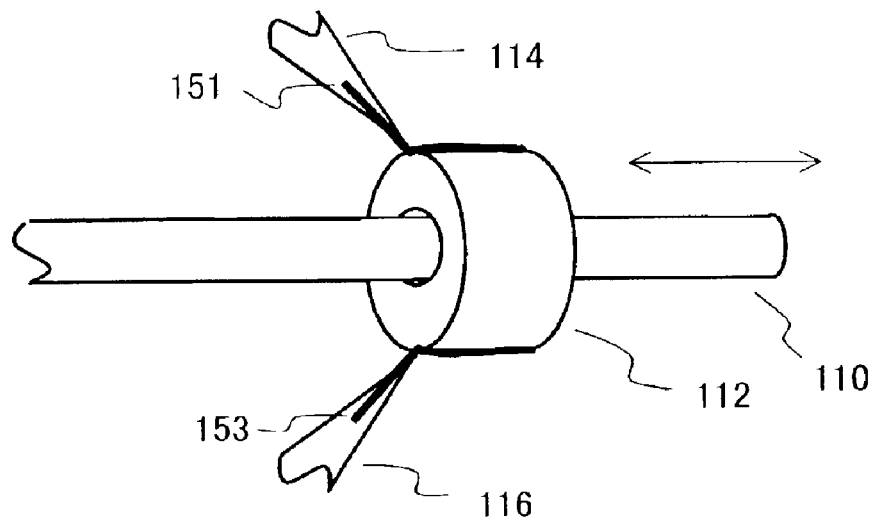
FIG. 12 is a schematic view illustrating an example of a connection between a first sliding member and the first connection member and a connection between the first sliding member and a second connection member.

FIG. 12 is a schematic view illustrating an example of the structure of the connection part between the first sliding member 112 and the first connection member 114 and the connection part between the first sliding member 112 and the second connection member 116.

In FIG. 12, the front edge of the first connection member 114 is glued to a string 151. The string 151 is glued to the first sliding member 112. The connection part between the first sliding member 112 and the first connection member 114 corresponds to a universal joint.

The front edge of the second connection member 116 is glued to a string 153. The string 153 is glued to the first sliding member 112. The connection part between the first sliding member 112 and the second connection member 116 corresponds to a universal joint.

The first sliding member 112 is slid parallel to the direction indicated by an arrow of FIG. 12. In FIG. 12, the sectional configuration of the first guide member 110 is circular. The sectional configuration of the hole bored through the first sliding member 112 which is in engagement therewith is circular. Alternatively, the sectional configuration of the first guide member and the sectional configuration of the hole of the first sliding member may be of any shapes, for example, squares. In this case, the rotational movement of the first sliding member around the first guide member as the rotational axis does not arise, the generation of errors accompanied by such a rotational movement of the first sliding member is prevented.

The structure of the connection part between the second sliding member 122 and the third connection member 124 and the connection part between the second sliding member 122 and the fourth connection member 126 includes a similar structure as the above-explained structure of the connection part between the first sliding member and the first connection member and the connection part between the first sliding member and the second connection member.

Figure 13:
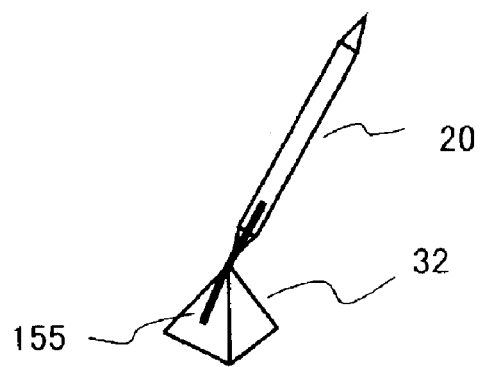
FIG. 13 is a schematic view illustrating an example of a connection between the arm and the common link connection member.

FIG. 13 in a schematic view illustrating an example of the structure between the arm 20 and the common link connection member 32.

In FIG. 13, one edge of the arm 20 is glued to a string 155. The common link connection member 32 is glued to the string 155. Namely, the connection part between the arm 20 and the common link connection member 32 corresponds to a universal joint.

In the above, the structure of the combined body of the driven mechanism 100, the arm 20, and the reflective direction directing member 40 has been explained in detail. The features of each reflector unit 10 is explained hereinbelow.

Figure 14:
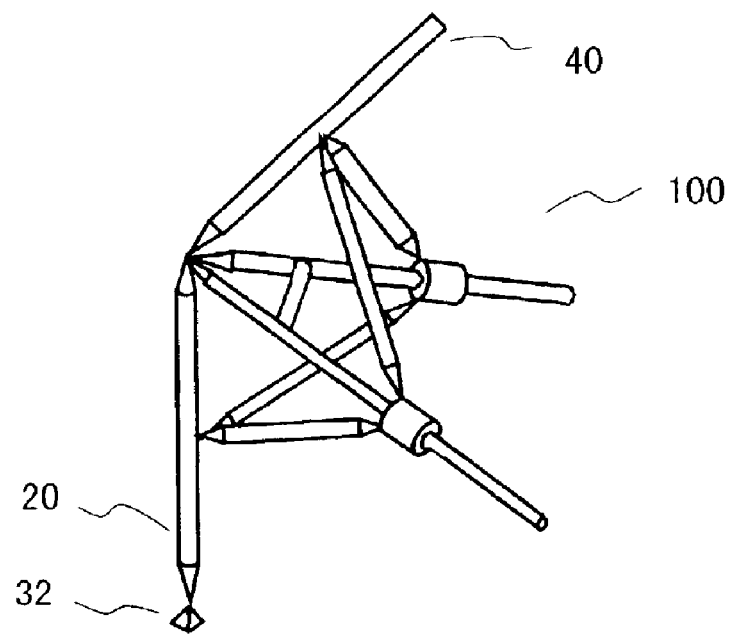
FIG. 14 is a schematic view illustrating an example of a change in shape of the driven mechanism when the reflective direction directing member is rotated.

First, the reflective direction directing member 40 has a degree of freedom so as to be directed toward any prescribed direction. FIG. 14 is a schematic view illustrating an example of the change in shape of the driven mechanism 100 when the reflective direction directing member is rotated.

Second, the arm 20 can be freely rotated around the first connection part 140. Thus, the concentration of solar radiation in any direction is achieved. As mentioned above, the first connection part 140 corresponds to the rotational fulcrum at the time of rotating the arm 20.

Third, when the reflective surface of the reflector 12 is a flat surface, the reflective surface is disposed parallel to the plane including the first guide member 110 and the second guide member 120. When the reflector includes a curved surface such as a concave mirror or a convex mirror, the reflective surface which is perpendicular to the optical axis is generally disposed parallel to the plane including the first guide member 110 and the second guide member 120.

Fourth, when the arm 20 is parallel to the incident solar radiation, the direction of the reflected light reflected by the reflector 12 is parallel to the direction directed by the reflective direction directing member 40. Namely, when the direction from the first connection part 140 toward the third connection part 144 is parallel to the propagation direction of the incident solar radiation, the propagation direction of the reflected solar radiation reflected by the reflector 12 becomes parallel to the direction from the first connection part 140 toward the second connection part 142.

Fifth, the reflective direction directing member 40 is fixed toward a prescribed direction by a reflective direction directing member fixing member (not shown) so that the reflective direction directing member 40 is directed toward the solar energy conversion apparatus 500. The reflective direction directing member fixing member tightly fixes the reflective direction directing member 40 so that the prescribed direction is not changed by an external force. When the solar energy conversion apparatus 500 moves or when the condensing ratio is adjusted, the prescribed direction directed by the reflective direction directing member 40 may be changed by an adjusting mechanism (not shown).

In the operation of the solar radiation reflecting apparatus illustrated in FIG. 1, the plurality of arms 20 are connected to the common link 30 so that the plurality of arms 20 are arranged parallel to each other. By changing the position of the common link, the plurality of arms 20 are simultaneously rotated with the same angular variation around the above-mentioned respective rotational fulcrums.

Figure 15:
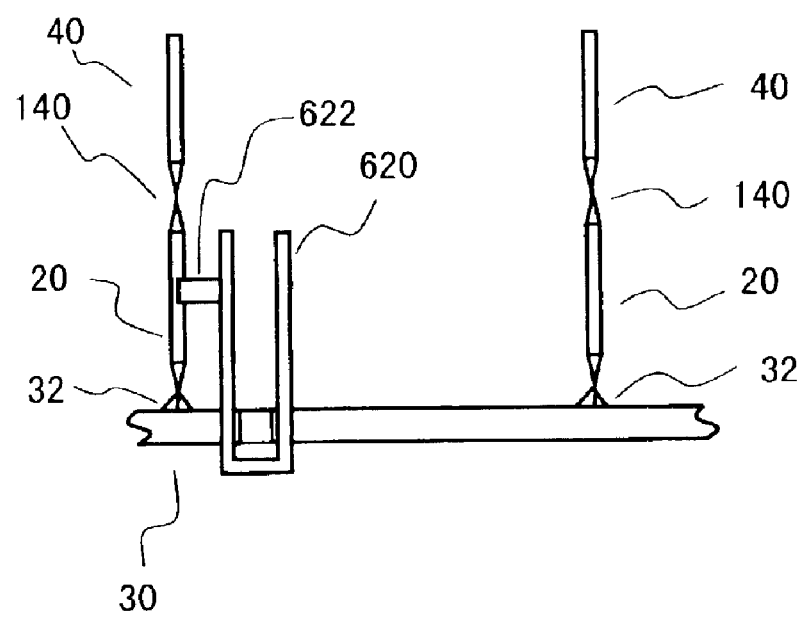
FIG. 15 is a schematic view illustrating a state of the plurality of arms.
Figure 16:
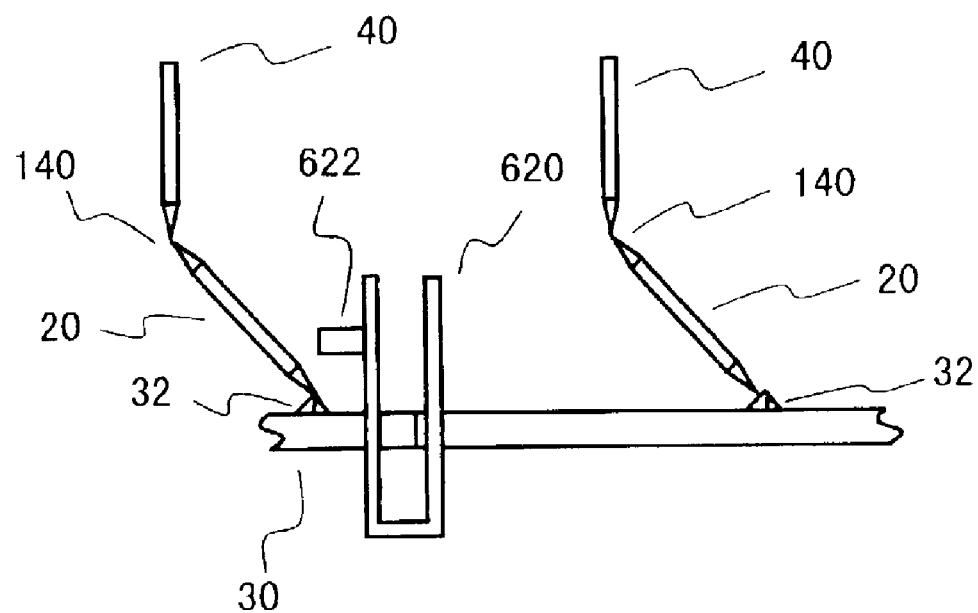
FIG. 16 is a schematic view illustrating another state of the plurality of arms.

Referring to FIG. 15 and FIG. 16, an example of the variation between before and after the rotation of the plurality of arms 20 around the first connection part 140 is explained. FIG. 15 is a schematic view illustrating a state of the plurality of arms 20. FIG. 16 is a schematic view illustrating a state of the plurality of arms 20 after a period of time has passed from the state illustrating FIG. 15.

In FIG. 15, the second driving member 620 begins to move from the left to the right of FIG. 15. As illustrated in FIG. 16, with the movement of the second driving member 620, the common link 30 is moved, and the plurality of arms 20 connected to the common link 30 are simultaneously rotated.

Figure 17:
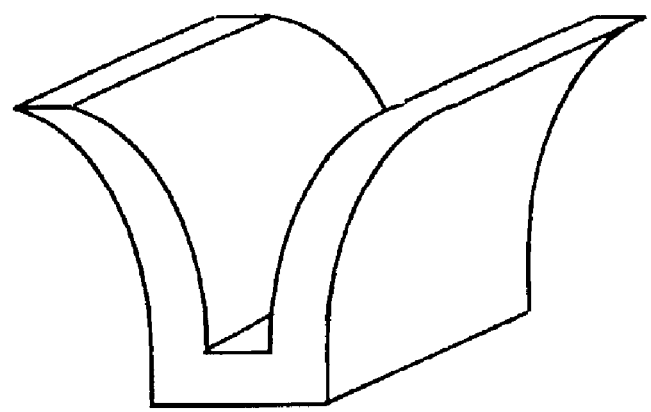
FIG. 17 is a schematic view illustrating another example of the shape which can be used as a driving member.

The ultrasonic vibrator 622 is provided for reducing the friction between the second driving member 620 and the common link 30. Namely, the friction is reduced when the second driving member 620 is vibrated finely by the ultrasonic vibrator 622, and the driving accuracy is improved. As a means for reducing such friction, another means may be used. For example, when a member for having the shape illustrated in FIG. 17 is used as the driving member, a bad influence due to the friction is reduced.

When the concentration of light at a high condensing ratio is performed, the connection point between the arm 20 and the common link connection member 32 is disposed on the straight line which passes through the first connection part 140 and the third connection part 144.

Figure 18:
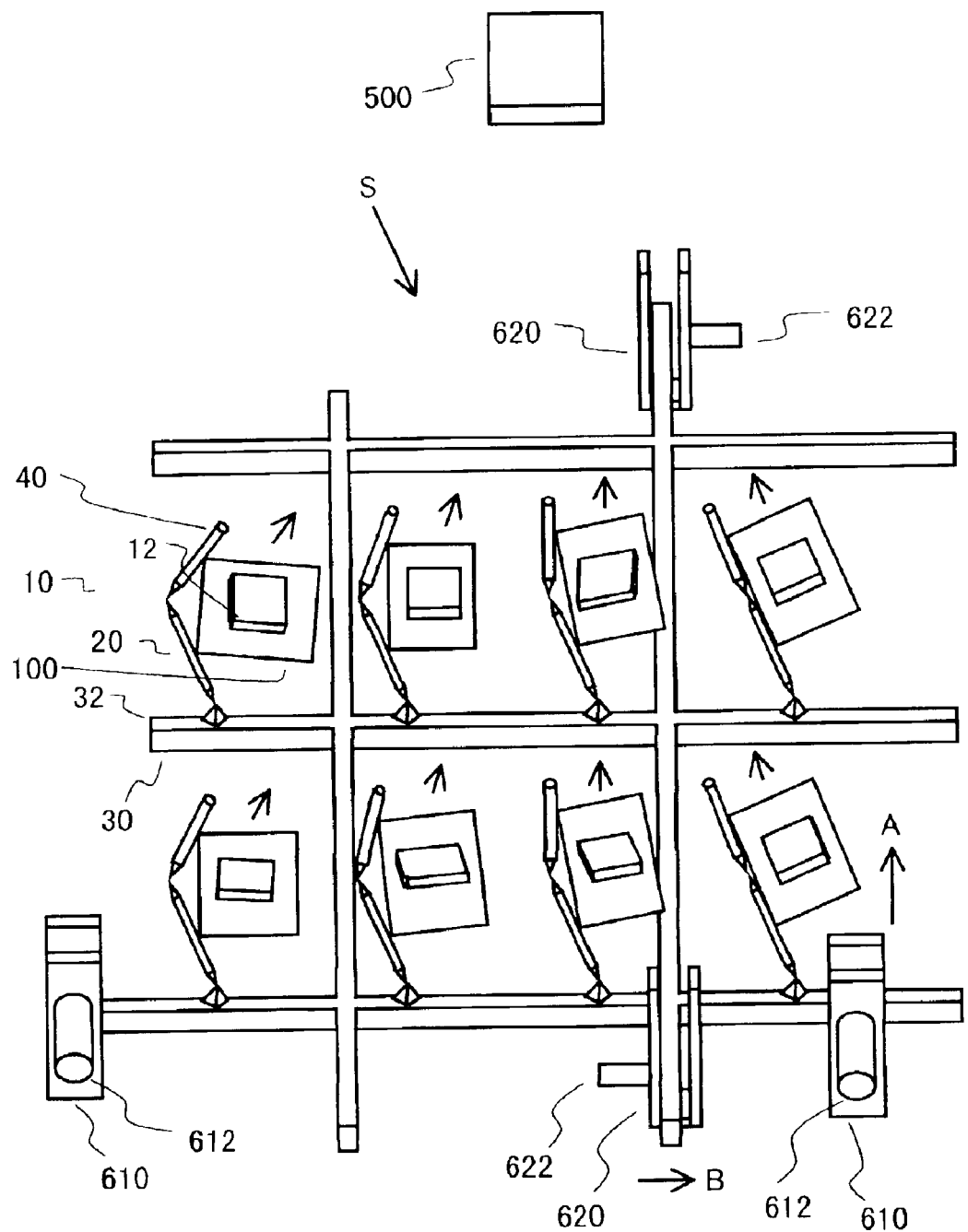
FIG. 18 is a conceptual view illustrating a state of the solar radiation reflecting apparatus which reflects solar radiation at another incident direction.

FIG. 18 is a conceptual view illustrating a state of the solar radiation reflecting apparatus when the incident direction of solar radiation has varied.

In FIG. 18, the incident solar radiation is in a state parallel to an arrow S. More in detail, it is incident obliquely to the direction indicated by the arrow B. In response to this, the second driving member 620 moves parallel to the direction indicated by the arrow B. Accordingly, the shape of the driven mechanism 100 accommodating the reflector 12 is changed, and the direct solar radiation is always reflected to the direction indicated by the reflective direction directing member 40 by each of the plurality of reflector units 10.

Figure 19:
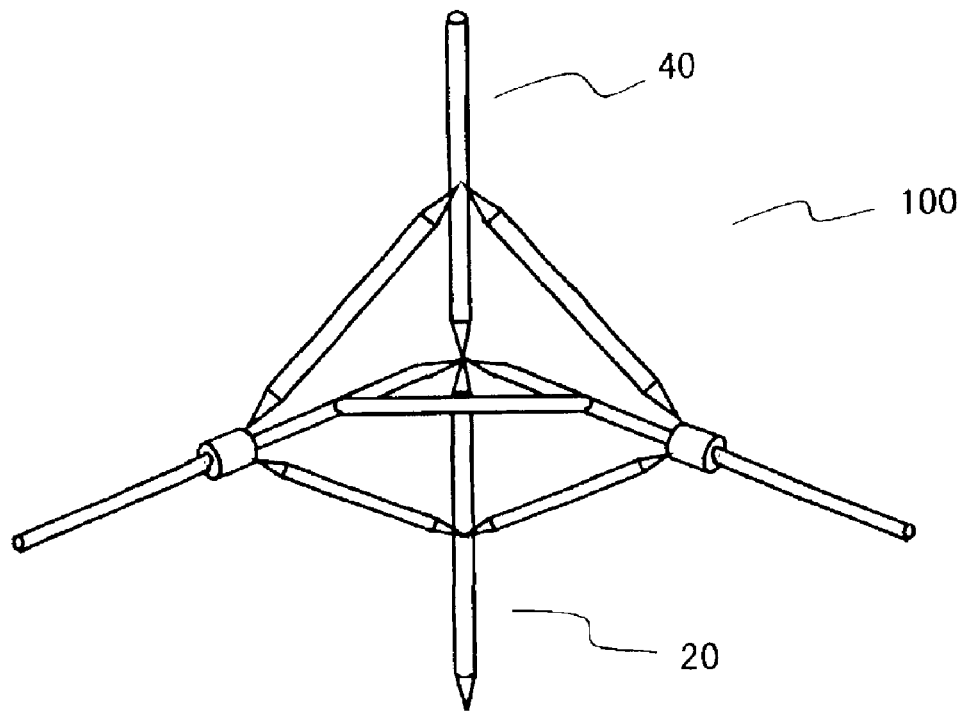
FIG. 19 is a schematic view illustrating a state of the driven mechanism which is rotated 90 degrees from the state of FIG. 3.
Figure 20:
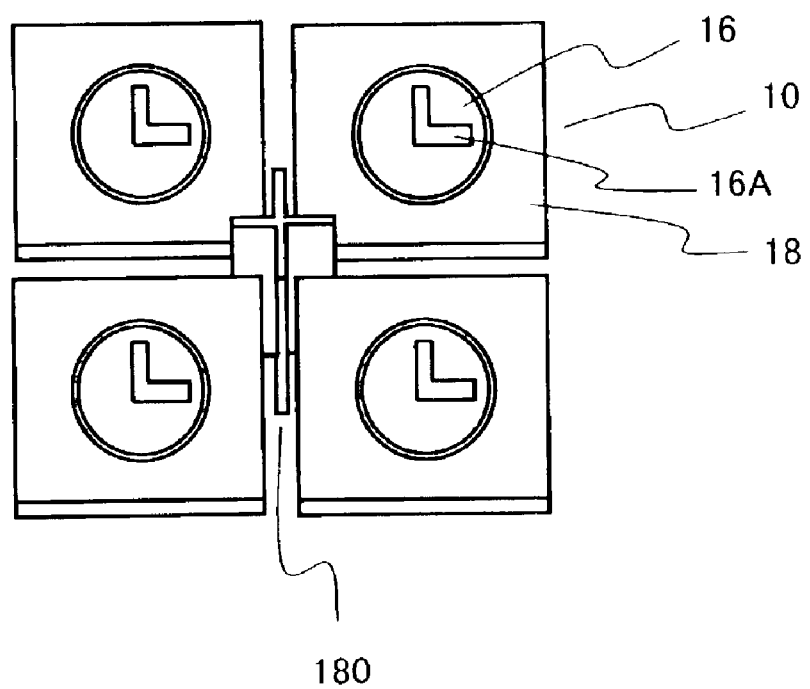
FIG. 20 is a schematic view illustrating another example of the plurality of reflector units.

In the state illustrated in FIG. 3, the driven mechanism 100 is capable of rotating around the straight line which passes through the reflective direction directing member 40 and the arm 20. FIG. 19 is a schematic view illustrating the state in which the driven mechanism 100 is rotated about 90 degree from the state of FIG. 3. When the plurality of reflector units are densely arranged in order to enhance the efficiency in collecting solar radiation, a reflector rotation preventing guide 180 illustrated in FIG. 20 may be provided for preventing such a rotation, for example. Namely, FIG. 20 is a schematic view illustrating another example of the plurality of reflector units having the reflector rotation preventing guide 180. In FIG. 20, each reflector unit 10 includes an inner circle mirror 16 which is rotated with the driven mechanism 100 in the plane of the reflector and an outer circumferential mirror 18 which is capable of being rotated in the plane of the reflector independently of the driven mechanism 100. A hole 16A is bored through the inner circle mirror 16 for the driven mechanism 100.

Figure 21:
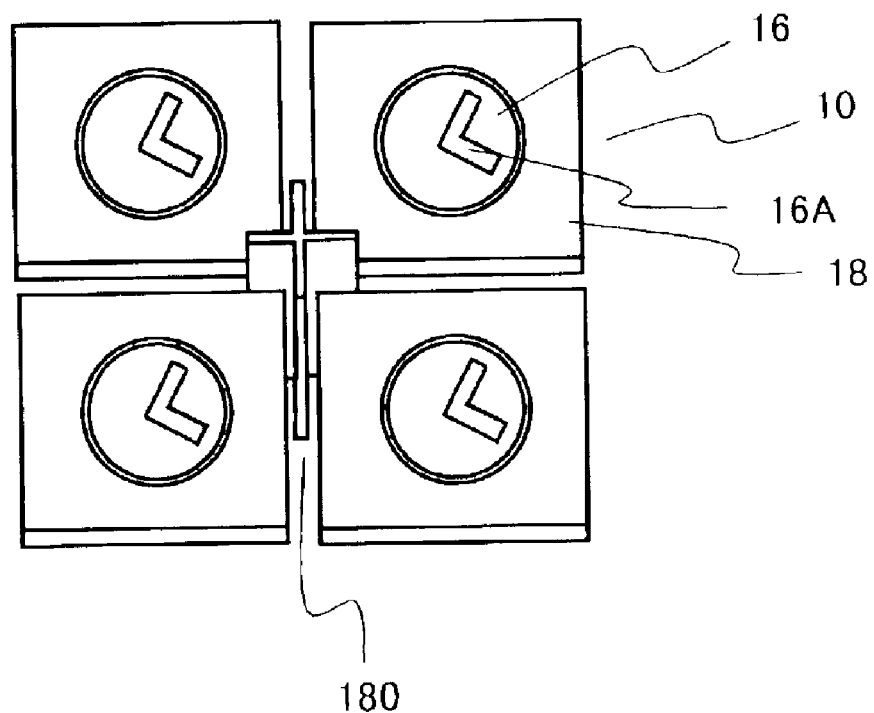
FIG. 21 is a schematic view illustrating a state of the reflector unit after the driven mechanism has been rotated.

FIG. 21 is a schematic view illustrating the arrangement state of the reflector unit 10 after the driven mechanism 100 is rotated. Although the inner circle mirror 16 is rotated, the rotation of the outer circumferential mirror 18 is prevented by the reflector rotation preventing guide 180.

Figure 22:
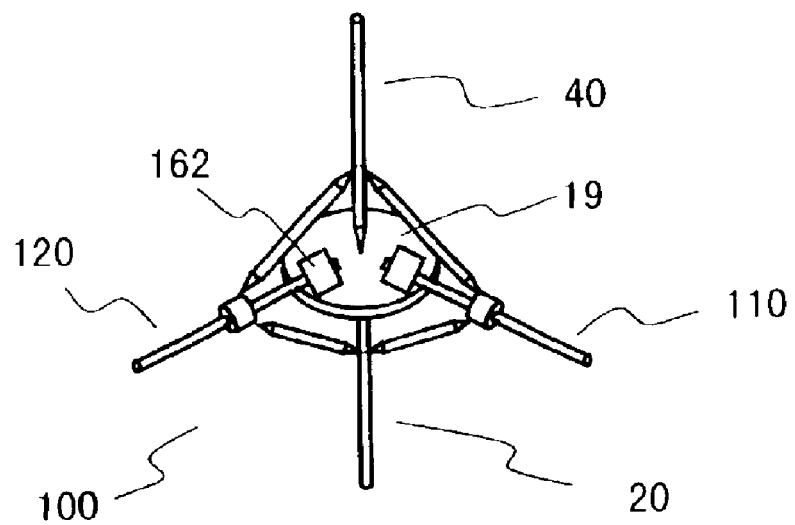
FIG. 22 is a schematic view illustrating another example of the structure of the driven mechanism.

FIG. 22 is a schematic view illustrating another example of the structure of the driven mechanism 100. In FIG. 22, the reflective direction directing member 40 is connected to a surface of a reflector 19. The connection part between the reflector 19 and the reflective direction directing member 40 corresponds to a universal joint. The arm 20 is connected to the rear surface of the reflector 19. The connection part between the reflector 19 and the arm 20 is a universal joint.

A first guide member 110 and a second guide member 120 are tightly fixed to the reflector 19 using an adhesive member 162, respectively. The extension line of the first guide member 110 passes through a connection part between the reflective direction directing member 40 and the reflector. The extension line of the second guide member 120 passes through a connection part between the reflective direction directing member 40 and the reflector In improving the accuracy of the driven mechanism 100 illustrated in FIG. 22, a thin plate-thickness of the central part of the reflector is preferred. Further, guide grooves may respectively be provided at the portions where the reflector 19 is brought into contact with the first guide member 110 and the second guide member 120. Accordingly, the extension line of the first guide member 110 crosses the extension line of the second guide member 120 near the connection part between the reflective direction directing member 40 and the reflector 19. An outer circle reflector (not shown) is provided around the outer circumference of the reflector 19.

In the driven mechanism illustrated in FIG. 22, a sliding member and a guide member illustrated in FIG. 49 which will be described later may be used. In this case, the condensing ratio is improved.

Figure 23:
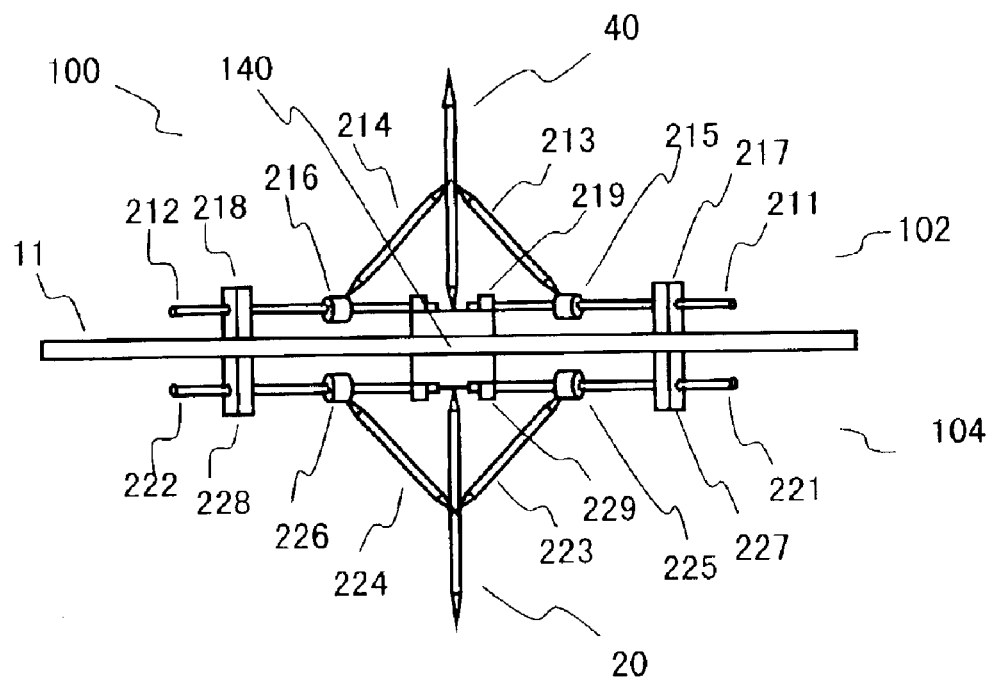
FIG. 23 is a schematic view illustrating still another example of the structure of the driven mechanism.

FIG. 23 is a schematic view illustrating still another example of the structure of the driven mechanism 100. The driven mechanism 100 includes a first driven unit 102 and a second driven unit 104. The first driven unit 102 is disposed on a surface of a reflector 11. The second driven unit 104 is disposed on the rear surface of the reflector 11.

Figure 24:
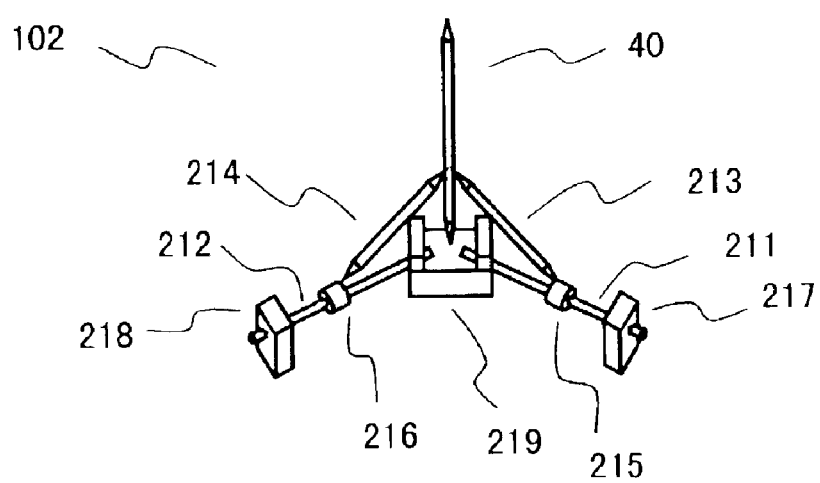
FIG. 24 is a schematic view illustrating an example of a first driven unit.

FIG. 24 is a schematic view illustrating the first driven unit 102. The first driven unit 102 includes a reflective direction directing member 40, a first guide member 211, a second guide member 212, a first connection member 213, a second connection member 214, a first sliding member 215, a second sliding member 216, a first base 217, a second base 218, and a third base 219. The first guide member 211 and the second guide member 212 are tightly fixed to the third base 219, respectively. The extension line of the first guide member 211 crosses the extension line of the second guide member 212 at the connection part between the reflective direction directing member 40 and the third base 219. The first base 217, the second base 218, and the third base 219 are tightly fixed to a surface of the reflector 11, respectively.

In FIG. 23, the second driven unit 104 includes an arm 20, a third guide member 221, a fourth guide member 222, a third connection member 223, a fourth connection member 224, a third sliding member 225, a fourth sliding member 226, a fourth base 227, a fifth base 228, and a sixth base 229. The third guide member 221 and the fourth guide member 222 are tightly fixed to the sixth base 229, respectively. The extension line of the third guide member 221 crosses the extension line of the fourth guide member 222 at the connection part between the arm 20 and the sixth base 229, respectively. The fourth base 227, the fifth base 228, and the sixth base 229 are tightly fixed to the rear surface of the reflector 11, respectively. The first base 217 is disposed opposite the fourth base 227. The second base 218 is disposed opposite the fifth base 228.

The length of the first connection member 213 is equal to the length of the third connection member 223. Further, the length of the second connection member 214 is equal to the length of the fourth connection member 224.

The first sliding member 215 is connected to the third sliding member 225 through a connection member (not shown), and is integrated and slides. Further, the second sliding member 216 is connected to the fourth sliding member 226 through a connection member (not shown), and is integrated and slides.

Figure 25:
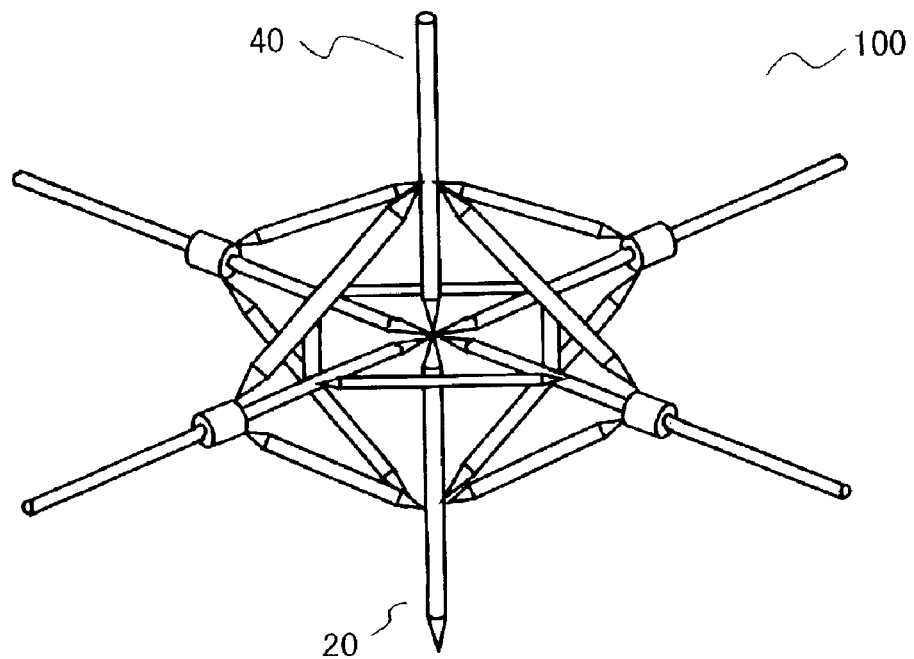
FIG. 25 is a schematic view illustrating still another example of the structure of the driven mechanism.

FIG. 25 is a schematic view illustrating still another example of the structure of the driven mechanism 100. The driven mechanism 100 illustrated in FIG. 25 has the structure in which the driven mechanism illustrated in FIG. 3 is combined.

Figure 26:
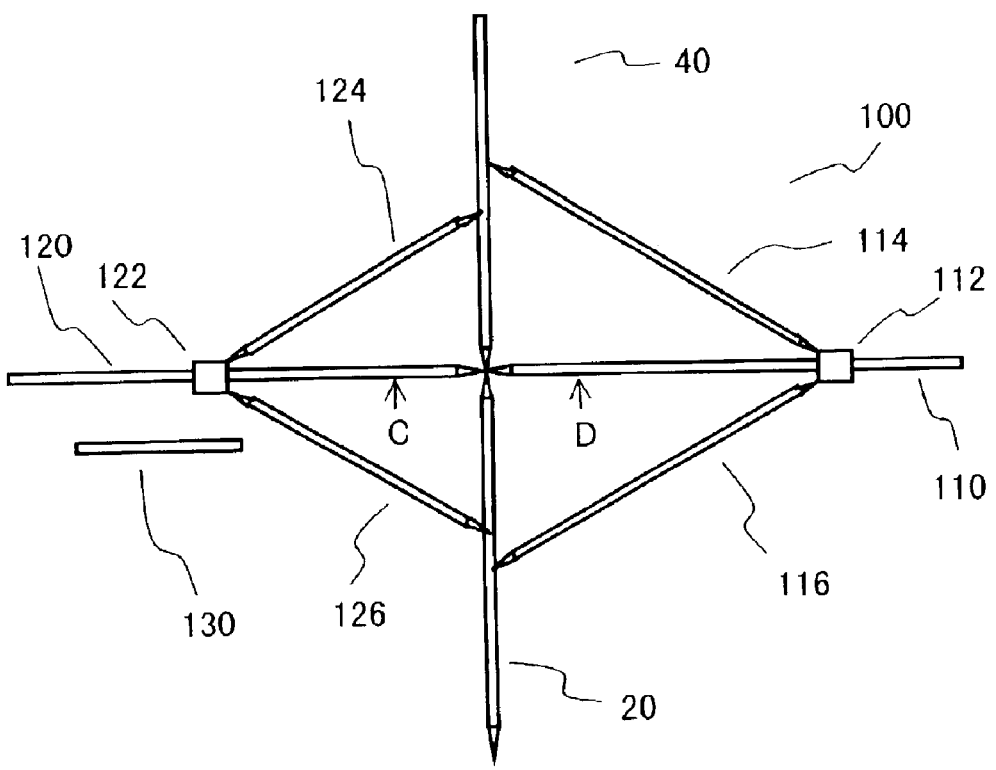
FIG. 26 is a developed drawing illustrating still another example of the structure of the driven mechanism.

FIG. 26 is a developed drawing illustrating still another example of the driven mechanism 100. In comparison with the driven mechanism illustrated in FIG. 3, the length of the first connection member 114, the length of the second connection member 116, the connection position between the first connection member 114 and the reflective direction directing member 40, and the connection position between the second connection member 116 and the arm 20 are changed, respectively.

The length of the first connection member 114 is equal to the length of the second connection member 116. The length of the third connection member 124 is equal to the length of the fourth connection member 126. The distance between the connection position where the arm 20 is connected to the direction indicating member 40 and the connection position where the first connection member 114 is connected to the reflective direction directing member 40 is equal to the distance between the connection position where the arm 20 is connected to the reflective direction directing member 40 and the connection position where the second connection member 116 is connected to the arm 20.

The length of the first guide member 110 may be changed so as to exceed the length of the second guide member 120.

Figure 27:
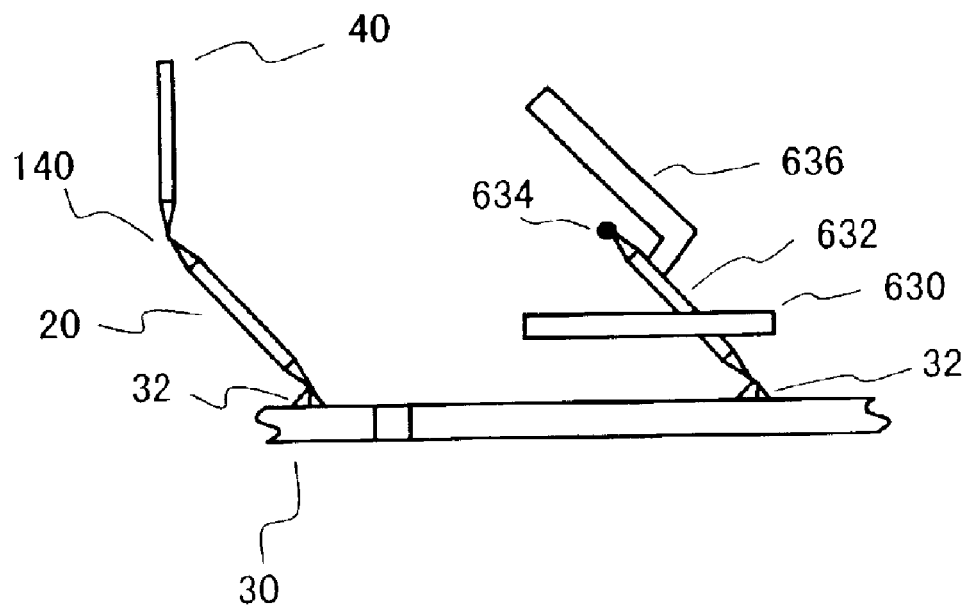
FIG. 27 is a conceptual view illustrating another example of the driving mechanism which drives the common link.

FIG. 27 is a conceptual view illustrating another example of the driving mechanism which drives the common link 30. The driving mechanism includes a driving bar 632 which is disposed parallel to the arm 20, a driving member 630 which rotates the driving bar 632, an optical sensor 636 which is disposed parallel to the driving bar 632, and a fulcrum member 634 which provides a free-rotation fulcrum for rotating the driving bar 632. The driving bar 632 is connected to a common link connection member 32, and transmits the force for driving the common link 30. The optical sensor 636 includes a lens and a photo-detection region which is divided into four. On the basis of a signal from the optical sensor 636, the driving mechanism controls the position of the driving bar 632.

As mentioned above, the optical sensor 636 is connected parallel to the driving bar 632. Alternatively, the optical sensor 636 may be parallel connected to one of the plurality of arms 20.

Figure 28:
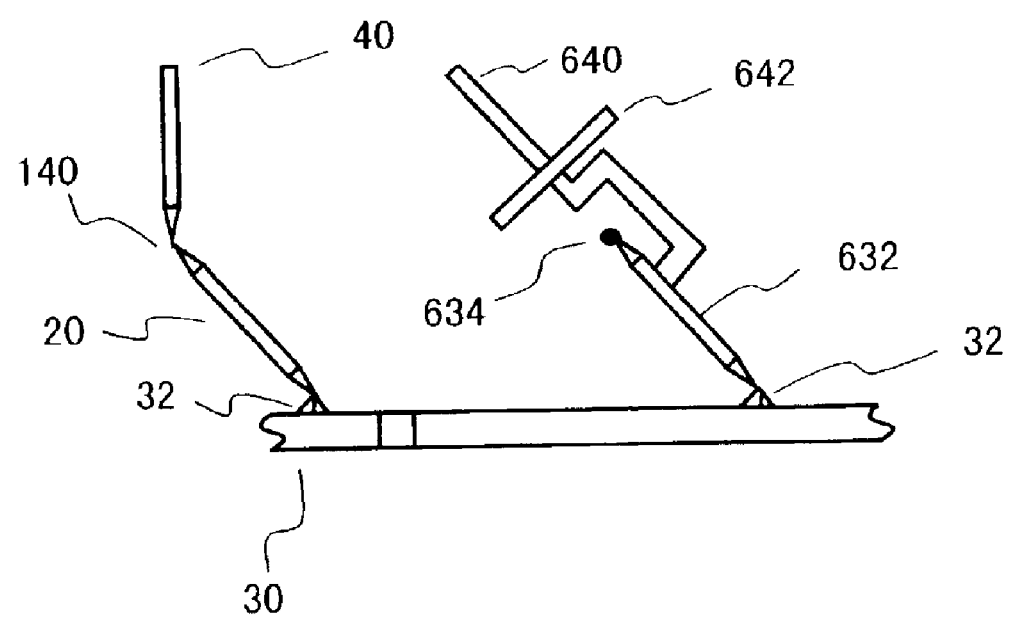
FIG. 28 is a conceptual view illustrating still another example of the driving mechanism which drives the common link.

FIG. 28 is a conceptual view illustrating still another example of the driving mechanism which drives the common link. The driving mechanism includes a driving bar 632 which is disposed parallel to the arm 20, a handle 640 for rotating the driving bar 632, a fulcrum member 634 which provides a free-rotation fulcrum for rotating the driving bar 632, and a projection plate 642 for projecting the shadow of the handle 640. The handle 640 penetrates through the projection plate 642, and is tightly connected to the driving bar 632. When the shadow of the handle 640 which is projected onto the projection plate 642 by the incident solar radiation vanishes, the direction of the arm 20 becomes parallel to the propagation direction of the incident solar radiation. The handle 640 may be manually driven. Alternatively, a driving means (not shown) may be provided. The driving means may include a mechanical system which drives the driving bar 632 so that the driving bar 632 always tracks solar radiation on the basis of the track of the sun in the installation region. Namely, the driving mechanism may include a tracking mechanism for tracking the incident direction of solar radiation.

Figure 29:
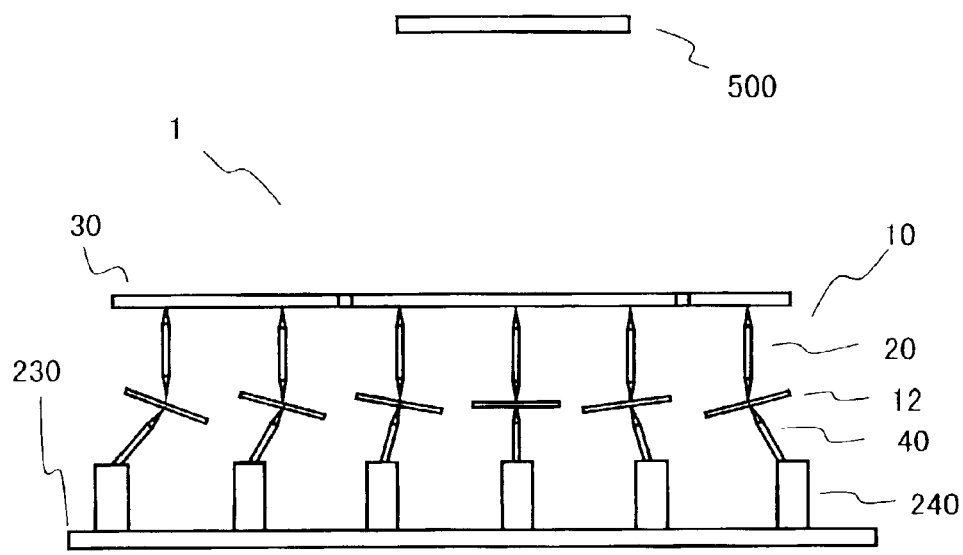
FIG. 29 is a conceptual view illustrating a solar energy system according to another embodiment of the present invention.

FIG. 29 is a conceptual view illustrating a solar energy system according to still another embodiment of the present invention. The solar energy system includes a solar radiation reflecting apparatus 1 having a plurality of reflector units 10, a plurality of arms 20, a common link 30, and a base plate 230 and a solar energy conversion apparatus 500. Each reflector unit 10 includes a driven mechanism (not shown), a reflector 12, a reflective direction directing member 40, and a reflective direction directing member fixing member 240. The reflective direction directing member fixing member 240 tightly fixes the reflective direction directing member 40 toward the solar energy conversion apparatus 500. The reflector 12 is connected to an upper part of the reflective direction directing member 40, and the arm 20 is connected onto the reflector 12. The common link 30 is connected onto the arm 20.

The solar energy conversion apparatus 500 may be a solar battery, a solar heat power generation system, a pair of solar heat turbine motors, a multi-effect distillation device, a solar illuminating apparatus, a cooker, a water heating device, a drier, a solar furnace, or a combined system thereof. When the solar energy conversion apparatus is used for distilling impurities-containing water such as saline water, the distillation device may distill the saline water which has absorbed vaporized water from the impurities-containing water in an absorption heat pump.

In order to prevent a force of a strong wind or adhesion of dust, a housing container having a transparent cover (not shown) may be provided to the solar radiation reflecting apparatus. The transparent cover having a prescribed rigidity may be used as the common link.

Figure 30:
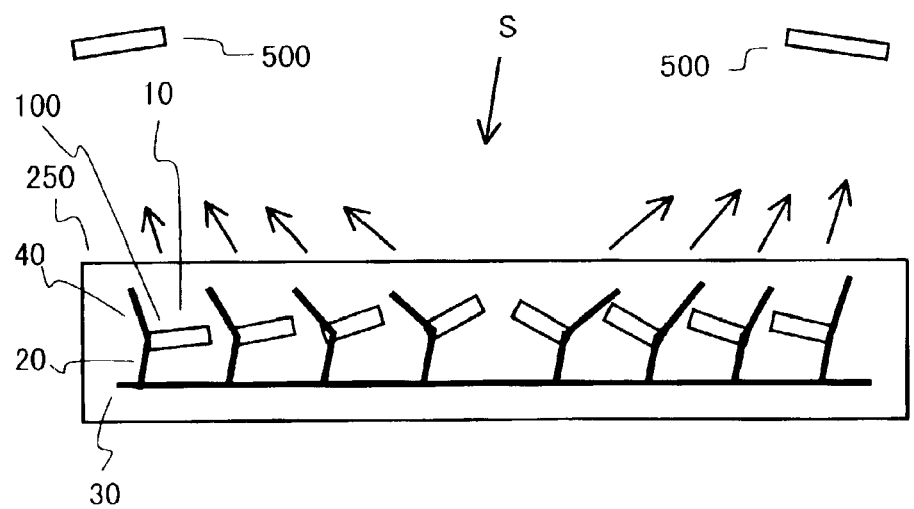
FIG. 30 is a conceptual view illustrating a solar radiation reflecting apparatus according to still another embodiment of the present invention.

FIG. 30 is a conceptual view illustrating a solar radiation reflecting apparatus according to still another embodiment of the present invention. The solar radiation reflecting apparatus includes a plurality of reflector units 10, a plurality of arms 20, a common link 30, and a water tank 250 having a transparent cover.

Each reflector unit 10 includes a driven mechanism 100, a reflector (not shown), and a reflective direction directing member 40. In the four reflector units 10 illustrated in the left side of FIG. 30, the reflective direction directing member 40 is tightly fixed toward a solar energy conversion apparatus 500 illustrated in the left side of FIG. 30. In the four reflector units 10 illustrated in the right side of FIG. 30, the reflective direction directing member 40 is tightly fixed toward a solar energy conversion apparatus 500 illustrated in the right side of FIG. 30. The common link 30 simultaneously drives the plurality of arms 20.

Namely, the solar radiation reflecting apparatus is a light concentrating apparatus having double focuses.

Optionally, a mechanism (not shown) for switching the direction of the reflective direction directing member may be provided. When the energy density of solar radiation decreases, solar radiation may be concentrated on either one of the solar energy conversion apparatuses 500.

Pure water is charged into the water tank 250. By the buoyancy by the pure water, the distortion of the reflector unit 10 due to own weight is prevented. Accordingly, the driven mechanism 100 is driven with a high-accuracy. Further, because the friction is reduced, the force which is required for driving the common link 30 is reduced. In addition, the pure water prevents the reflection by one surface of the transparent cover. The prescribed reflective direction and the direction of the arm may be corrected, taking into account of the refraction of light at the transparent cover.

In preferably operating the solar radiation reflecting apparatus including the water tank 250, it is important to maintain transparency of the water and to prevent the generation of air bubbles. From this point of view, the step for purifying water such as filtration, removal of impurities by a reverse osmosis module, and so forth may be performed. Further, the step for removing the gas dissolved in the water in a decompressed atmosphere may be performed, for preventing the generation of bubbles.

Figure 31:
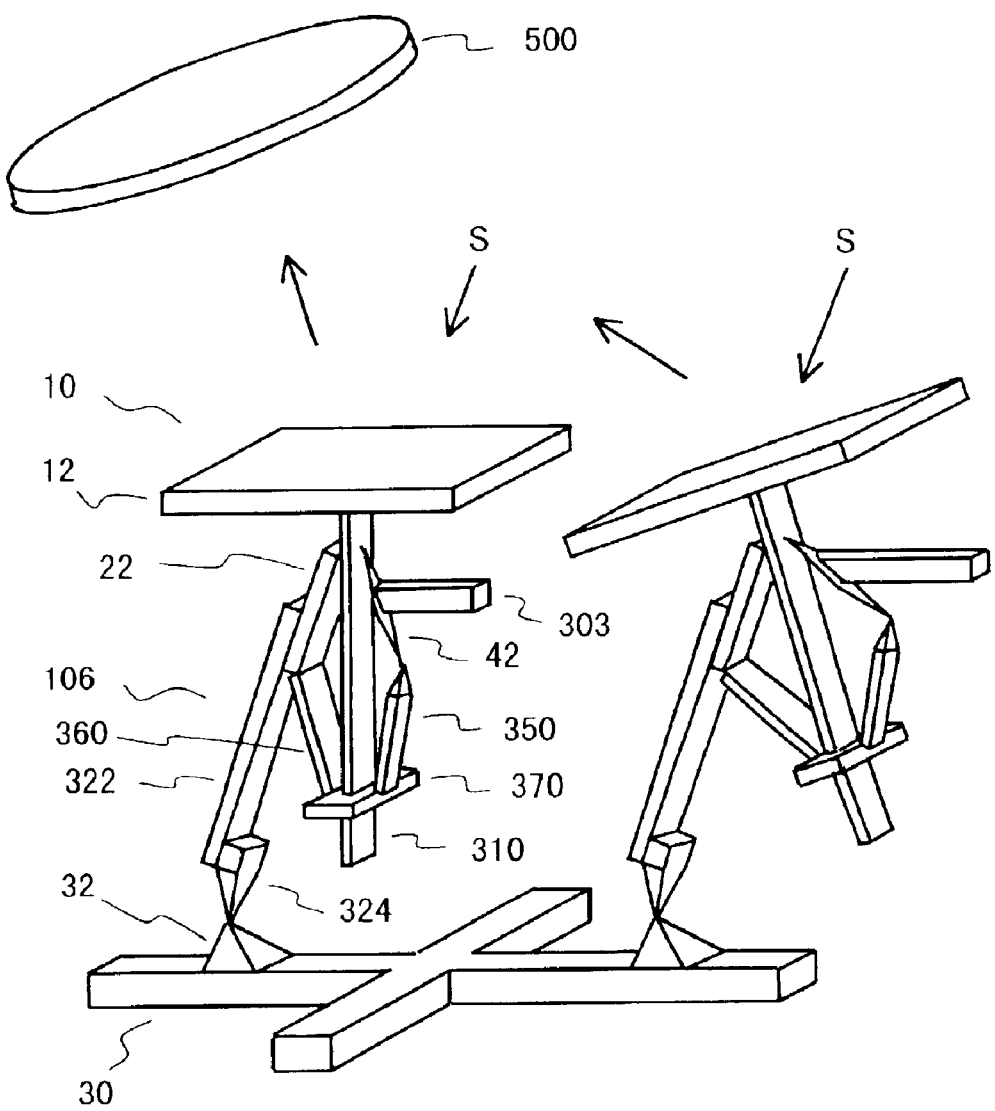
FIG. 31 is a schematic view illustrating a solar radiation reflecting apparatus according to still another embodiment of the present invention.

FIG. 31 is a schematic view illustrating a solar radiation reflecting apparatus according to still another embodiment of the present invention. The solar radiation reflecting apparatus is explained referring to FIGS. 31–40.

The solar radiation reflecting apparatus includes a plurality of reflector units 10, a plurality of arms 22, and a common link 30.

The plurality of arms 22 are disposed parallel to each other. In order to connect each arm 22 to the common link 30, a common link connecting bar 322 having a front edge part 324 and a common link connecting member 32 are provided. The front edge part 324 is connected to the common link connecting member 32. The connection part corresponds to a universal joint.

A driving mechanism (not shown) is provided for driving the common link 30. The common link 30 simultaneously rotates the plurality of arms 22 so that the plurality of arms 22 are caused to be parallel to the incident solar radiation. An arrow S of FIG. 31 designates the propagation direction of the incident solar radiation. The driving mechanism may include a tracking mechanism for tracking solar radiation.

Each reflector unit 10 includes a reflector 12, a reflective direction directing member 42, a reflective direction directing member fixing member 303 which tightly fixes the reflective direction directing member 42, and a driven mechanism 106.

The driven mechanism 106 includes a reflector vertical bar 310, a first pivot bar 350, a second pivot bar 360, and a sliding member 370.

The reflector vertical 310 is connected perpendicular to a reflective surface of the reflector 12.

The length of the first pivot bar 350 is equal to the length of the second pivot bar 360.

The sliding member 370 is mounted to the reflector vertical bar 310.

Figure 32:
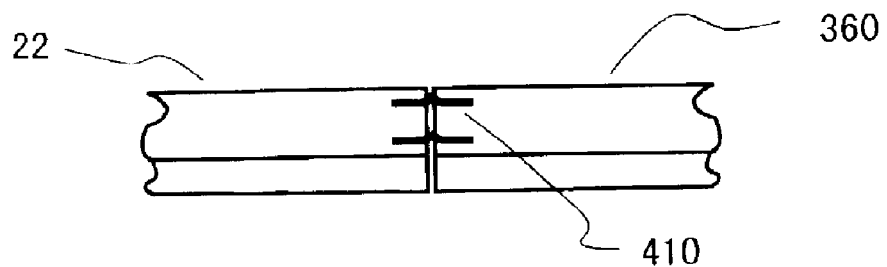
FIG. 32 is a schematic view illustrating an example of a connection between a second pivot bar and an arm.

FIG. 32 is a schematic view illustrating an example of the connection between the second pivot bar 360 and the arm 22. A pair of strings 410 connects a ridge at the front edge part of the arm 22 to a ridge of the second pivot bar 360. Namely, the second pivot bar 360 and the arm 22 are respectively capable of rotating around the ridge of the connection part as a pivot axis. The connection part corresponds to a pivot joint.

Figure 33:
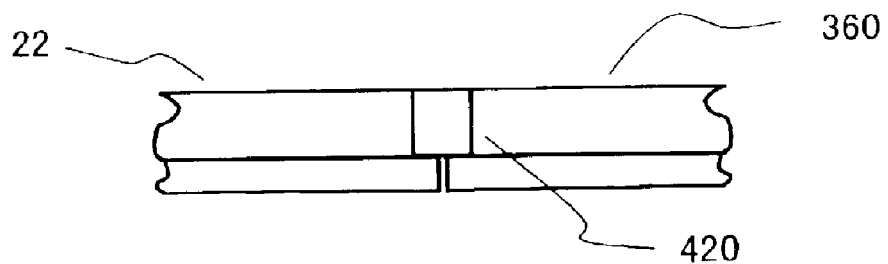
FIG. 33 is a schematic view illustrating another example of the connection between the second pivot bar and the arm.

FIG. 33 is a schematic view illustrating another example of the connection between the second pivot bar 360 and the arm 22. As an alternative to the pair of strings 410 illustrated in FIG. 32, an adhesive member 420 such as an adhesive tape having flexibility is used. The connection part corresponds to a pivot joint.

Figure 34:
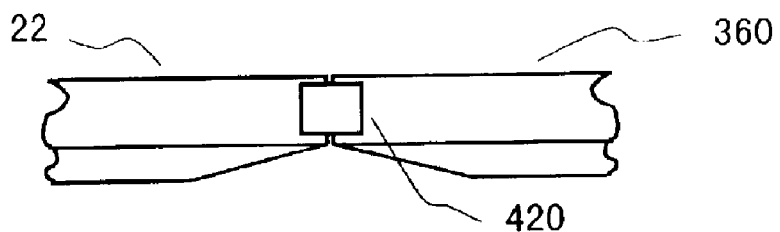
FIG. 34 is a schematic view illustrating still another example of the connection between the second pivot bar and the arm.

FIG. 34 is a schematic view illustrating another example of the connection between the second pivot bar 360 and the arm 22. As the arm 22 and the second pivot bar 360, bars having respective acute ridges are used. The acute ridge of the arm 22 is connected to the acute ridge of the second pivot bar 360 by an adhesive member 420. The connection part corresponds to a pivot joint. An adhesive member (not shown) may be provided on the rear surface.

Figure 35:
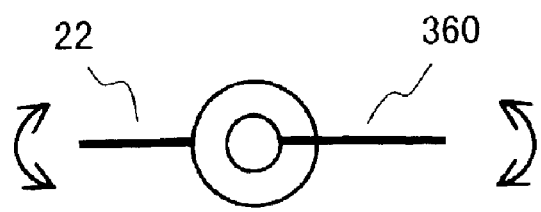
FIG. 35 illustrates a symbol representing a pivot joint.

FIG. 35 designates a symbol representing the above-explained pivot joint. Namely, in FIG. 35, the arm 22 is connected to the second pivot bar 360 through a pivot joint.

Figure 36:
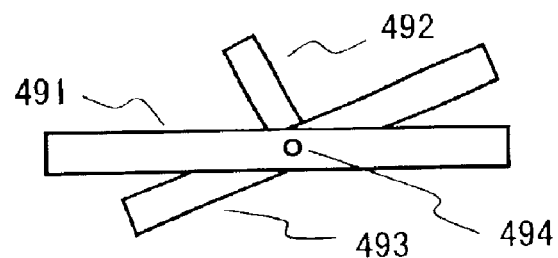
FIG. 36 is a schematic view illustrating an example of a pivot joint connecting three plates.

FIG. 36 is a schematic view illustrating an example of the pivot joint connecting three plates. In FIG. 36, plates 491, 492, and 493 are connected by a pin 494. The pivot axis corresponds to the pin 494.

Figure 37:
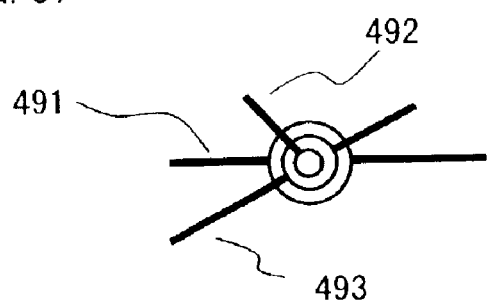
FIG. 37 illustrates a symbol representing the form of connection by the pivot joint illustrated in FIG. 36.

FIG. 37 illustrates a symbol representing the form of connection by the pivot joint illustrated in FIG. 36. In FIG. 37, the plates 491, 492, and 493 are connected through the pivot axis.

Figure 38:
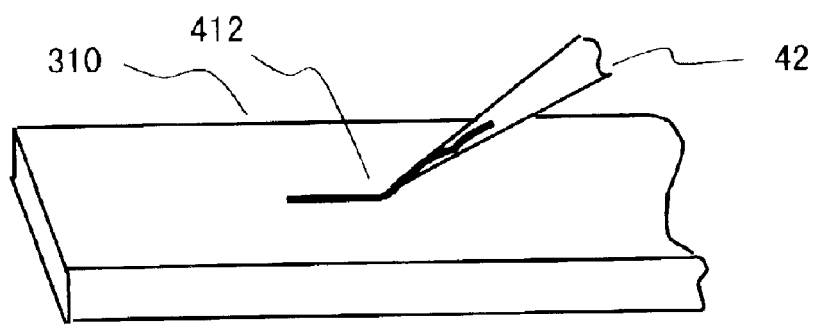
FIG. 38 is a schematic view illustrating an example of a connection between a reflector vertical bar and a reflective direction directing member.

FIG. 38 is a schematic view illustrating an example of the connection part between the reflector vertical bar 310 and the reflective direction directing member 42. The reflector vertical bar 310 is connected to the reflective direction directing member 42 by a string 412. That connection part corresponds to a universal joint.

Figure 39:
FIG. 39 is a schematic view illustrating an example of a connection between the reflective direction directing member and a first pivot bar.

FIG. 39 is a schematic view illustrating an example of the connection part between the reflective direction directing member 42 and the first pivot bar 350. The reflective direction directing member 42 is connected to the first pivot bar 350 by a string 414. The connection part corresponds to a universal joint.

The connection part between the arm 22 and the second pivot bar 360, the connection part between the sliding member 370 and the first pivot bar 350, and the connection part between the sliding member 370 and the second pivot bar 360 correspond to pivot joints.

Figure 40:
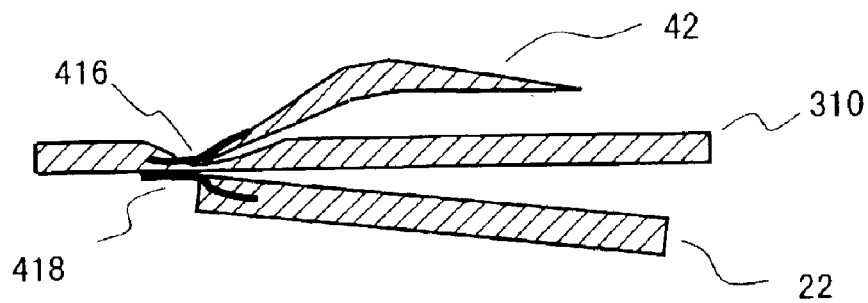
FIG. 40 is a sectional view illustrating another example of the connection among the arm, the reflector vertical bar, and the reflective direction directing member.

FIG. 40 is a sectional view illustrating another form of the connection among the arm 22, the reflector vertical bar 310, and the reflective direction directing member 42. A concave portion is formed in the reflector vertical bar 310, in which the reflective direction directing member 42 is connected to the concave part through an adhesive member 416. The arm 22 is connected to the reflector vertical bar 310 through an adhesive member 418.

Figure 41:
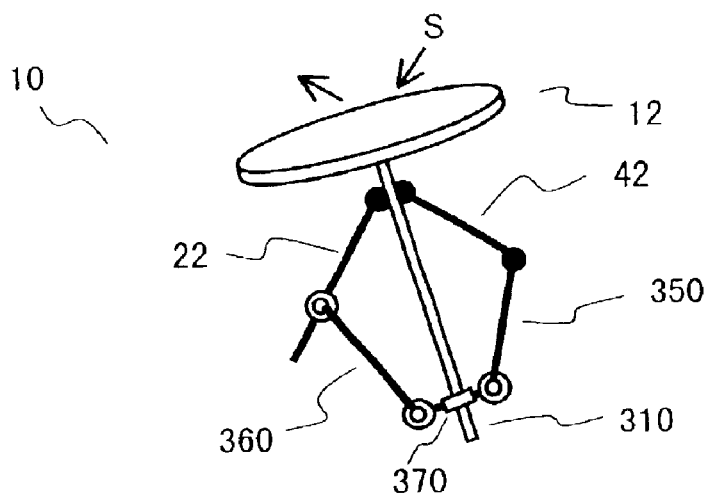
FIG. 41 is a conceptual view illustrating another example of the reflector unit.

FIG. 41 is a conceptual view illustrating another example of the reflector unit. The reflector unit 10 includes a reflective direction directing member 42, a first pivot bar 350 which is connected to the reflective direction directing member 42, a sliding member 370 which is connected to the first pivot bar 350, a second pivot bar 360 which is connected to the sliding member 370, a reflector vertical bar 310 which is mounted to the sliding member, and a reflector 12 which is connected to the reflector vertical bar 310. The arm 22 and the reflective direction directing member 42 are connected to the reflector vertical bar 310. The second pivot bar 360 is connected to the arm 22.

The connection part between the reflective direction directing member 42 and the reflector vertical bar 310, the connection part between the reflective direction directing member 42 and the first pivot bar 350, and the connection part between the arm 22 and the reflector vertical bar 310 correspond to universal joints, respectively.

The connection part between the arm 22 and the second pivot bar 360, the connection part between the second pivot bar 360 and the sliding member 370, and the connection part between the sliding member 370 and the first pivot bar 350 correspond to pivot joints, respectively.

Figure 42:
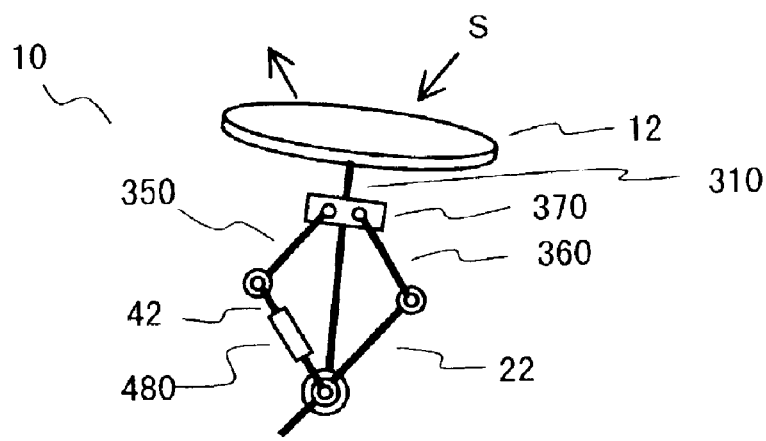
FIG. 42 is a conceptual view illustrating still another example of the reflector unit.

FIG. 42 is a conceptual view illustrating still another example of the reflector unit 10. The reflector units 10 includes a reflective direction directing member 42, a first pivot bar 350 which is connected to the reflective direction directing member 42, a sliding member 370 which is connected to the first pivot bar, a second pivot bar 360 which is connected to the sliding member 370, a reflector vertical bar 310 which is mounted to the sliding member 370, a rotational bearing 480, and a reflector 12 which is connected to the reflector vertical bar 310. The arm 22 and the reflective direction directing member 42 are connected to the reflector vertical bar 310, respectively. The second pivot bar 360 is connected to the arm 22. The rotational bearing 480 is provided for rotating the overall reflector unit 10 around the reflective direction directing member 42 as the rotational axis.

The connection part between the sliding member 370 and the first pivot bar 350, the connection part between the sliding member 370 and the second pivot bar 360, the connection part between the second pivot bar 360 and the arm 22, the connection part between the arm 22 and the reflective direction directing member 42, and the connection part between the reflective direction directing member 42 and the first pivot bar 350 correspond to pivot joints, respectively.

Figure 43:
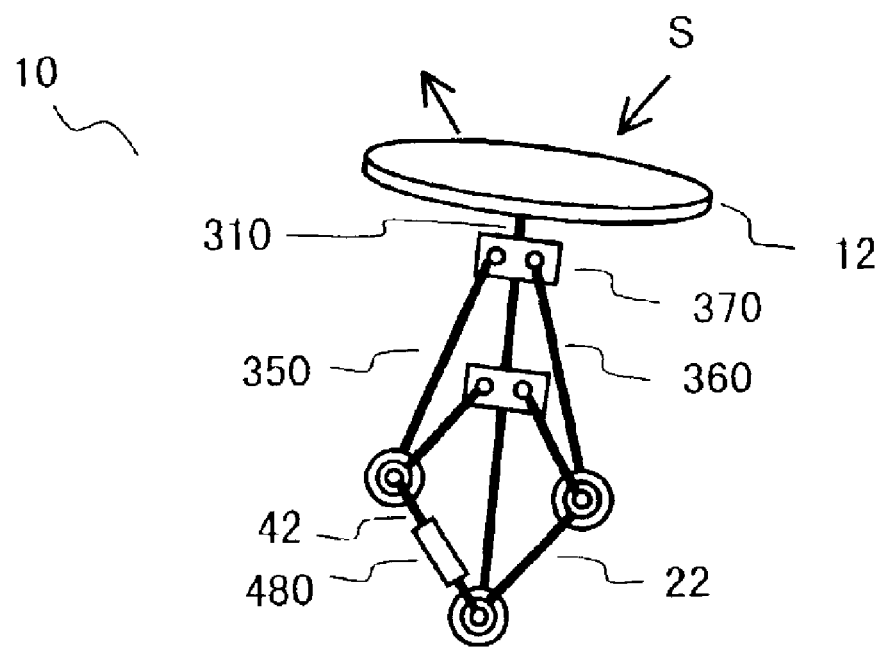
FIG. 43 is a conceptual view illustrating still another example of the reflector unit.

FIG. 43 is a conceptual view illustrating still another example of the reflector unit 10. The reflector unit 10 includes a reflective direction directing member 42, a pair of first pivot bars 350 which are connected to the reflective direction directing member 42, a pair of sliding members 370 which are respectively connected to the first pivot bars, a pair of second pivot bars 360 which are respectively connected to the pair of sliding members 370, a reflector vertical bar 310 which is mounted to the pair of sliding members, a rotational bearing 480, and a reflector 12 which is connected to the reflector vertical bar 310. The arm 22 and the reflective direction directing member 42 are connected to the reflector vertical bar 310. The second pivot bars 360 are connected to the arm 22. The rotational bearing 480 is provided for rotating the overall reflector unit 10 around the reflective direction directing member 42 as the rotational axis.

In FIG. 43, all connection parts correspond to pivot joints.

Figure 44:
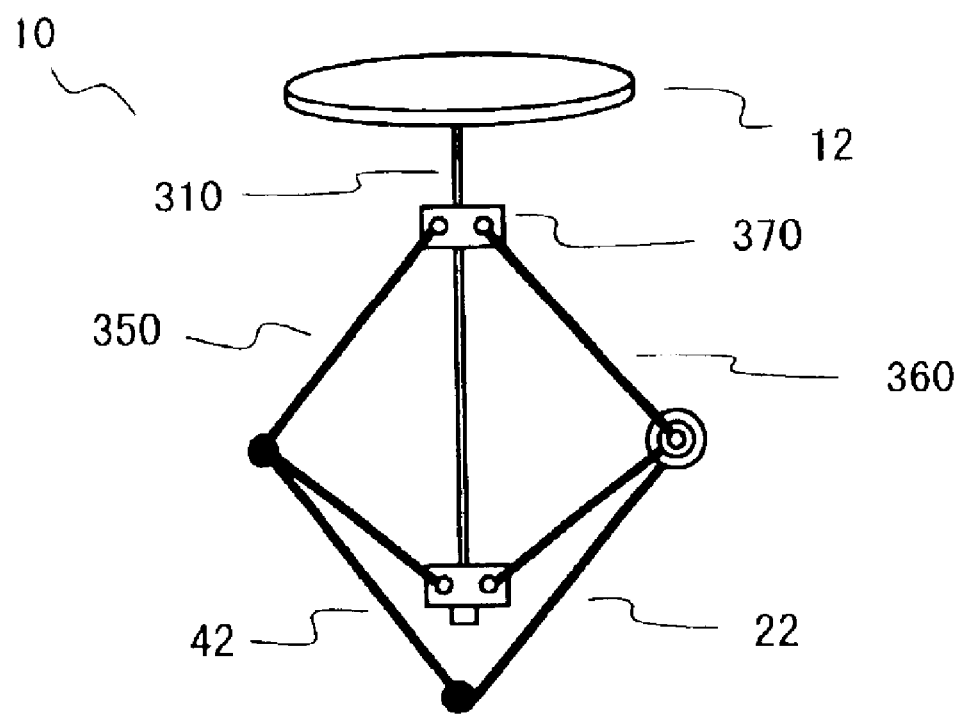
FIG. 44 is a conceptual view illustrating still another example of the reflector unit.

FIG. 44 is a conceptual view illustrating still another example of the reflector unit. The reflector unit 10 includes a reflective direction directing member 42, a pair of first pivot bars 350 which are connected to the reflective direction directing member 42, a pair of sliding members 370 which are respectively connected to the pair of first pivot bars 350, a pair of second pivot bars 360 which are respectively connected to the pair of sliding members 370, a reflector vertical bar 310 which is mounted to the pair of sliding members 370, and a reflector 12 which is connected to the reflector vertical bar 310.

In FIG. 44, the connection parts between the reflective direction directing member 42 and the pair of first pivot bars 350 and the connection part between the reflective direction directing member 42 and the arm 22 correspond to universal joints, respectively. The connection parts between the pair of first pivot bars 350 and the pair of sliding members 370, the connection parts between the pair of sliding members 370 and the pair of first pivot bars 350, and the connection parts between the arm 22 and the pair of second pivot bars 360 correspond to pivot joins, respectively.

Figure 45:
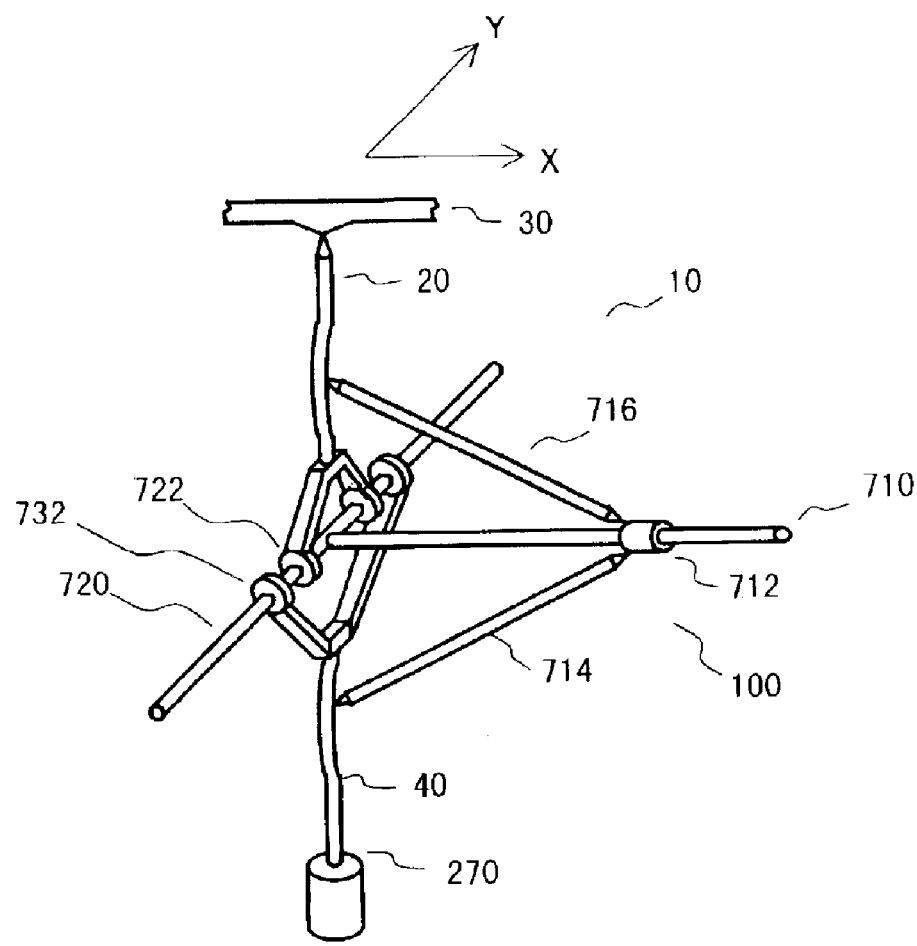
FIG. 45 a conceptual view illustrating still another example of the reflector unit.

FIG. 45 is a schematic view illustrating another example of the above-mentioned reflector unit. The reflector unit can be loaded on the solar radiation reflecting apparatus illustrated in FIG. 29.

The reflector unit 10 includes an arm 20, a reflective direction directing member 40, a driven unit 100, and a reflector (not shown).

The reflective direction directing member 40 is fixed in the state so as to be capable of rotating around the reflective direction directing member 40 as the rotational axis by a bearing 270 as a reflective direction directing member fixing member. With the rotation of the reflective direction directing member 40, the driven mechanism 100 is rotated.

The driven mechanism 100 includes a guide member 710, a sliding member 712 which is slid the guide member 710, a first connection member 714, a second connection member 716 having the same length as the first connection member, and a sub bar 720.

The distance between the point of intersection between the guide bar 710 and the sub bar 720 and the connection point between the arm 20 and the second connection member 716 is equal to the distance between the point of intersection and the connection point between the reflective direction directing member 40 and the first connection member 714.

The arm 20 has a curved shape such that the point of intersection between the guide bar 710 and the sub bar 720, the connection point between the arm 20 and the second connection member 716, and the connection point between the arm 20 and a common link 30 are disposed on a straight line.

The point of intersection between the guide bar 710 and the sub bar 720 and the connection point between the reflective direction directing member 40 and the first connection member 714 are disposed on a rotational axis by the bearing 270 or the extension line thereof, respectively.

A pair of joints 722 are provided between the arm 20 and the sub bar 720. The arm 20 is capable of rotating around the sub bar 720 as the pivot axis. The extension direction of the arm 20 is perpendicular to the extension direction of the sub bar 720.

As an alternative to the pair of joints 722, the arm 20 may be connected to the sub bar 720 through strings for forming a pair of universal joints. In this case, durability of the driven mechanism 100 against the adhesion of sand, dust and so forth is improved.

A pair of joints 732 are provided between the reflective direction directing member 40 and the sub bar 720. The extension direction of the reflective direction directing member 40 is perpendicular to the extension direction of the sub bar 720. The reflective direction directing member 40 is capable of rotating around the sub bar 720 as the pivot axis. As an alternative to the pair of joints 732, the reflective direction directing member 40 may be connected to the sub bar 720 through strings for forming the pair of universal joints.

The reflector (not shown) is supported parallel to a plane including the guide bar 710 and the sub bar 720.

Figure 46:
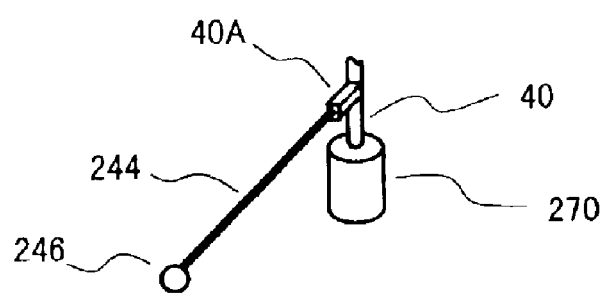
FIG. 46 is a schematic view illustrating a torque providing means which is provided to the reflector unit illustrated in FIG. 45.

With the movement of the common link 30, the arm 20 is rotated. In the state illustrated in FIG. 45, or the state in which the common link 30 is parallel to the arm 20, the common link 30 does not give any rotational force around the bearing 270. Therefore, the movement of the common link 30 in the direction parallel to the arrow Y encounters obstacles. In contrast, the movement of the common link 30 in the direction parallel to the arrow X is smooth. Namely, it is important to prevent the rotation of the driven mechanism 100 in an undesirable direction due to an external force such as a wind. For example, as illustrated in FIG. 46, a torque providing means maybe provided, which includes an elastic string 244 which gives weak restitutive rotational force around the reflective direction directing member 40 to the reflective direction directing member 40 through a projecting part 40A and a fixing member 246 which fixes the elastic string 244.

When the reflective direction directing member 40 is fixed obliquely, the undesirable rotation of the reflective direction directing member 40 may be prevented by positioning the center of gravity of the reflector unit 10 at the position apart from the extension line of the rotational axis by the bearing 270. Further, the arm 20 and/or the reflective direction directing member 40 may be formed using an elastic body having prescribed rigidity. The common link is driven smooth by using such an elastic body.

Figure 47:
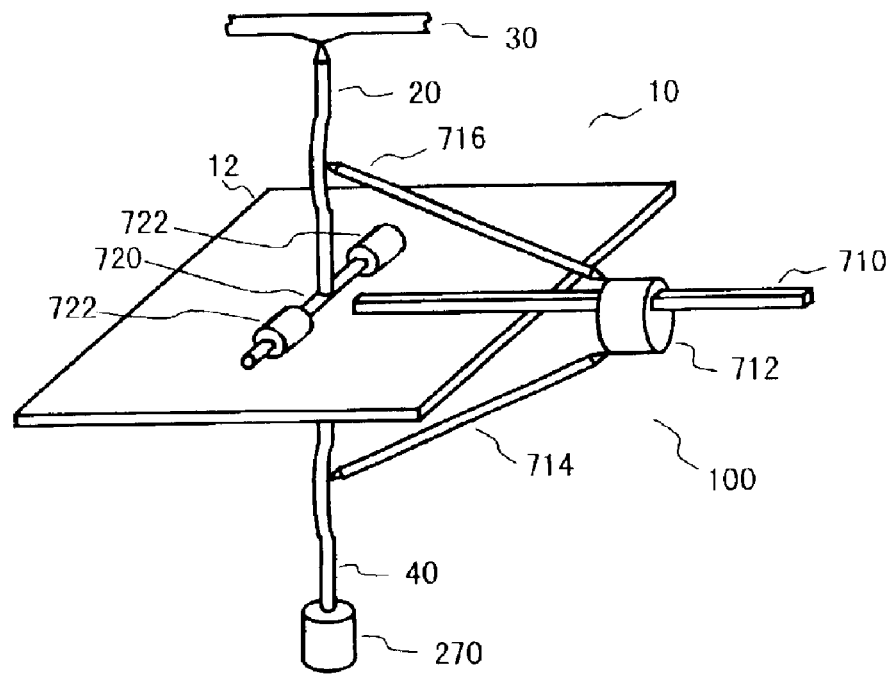
FIG. 47 is a schematic view illustrating still another example of the reflector unit.
Figure 48:
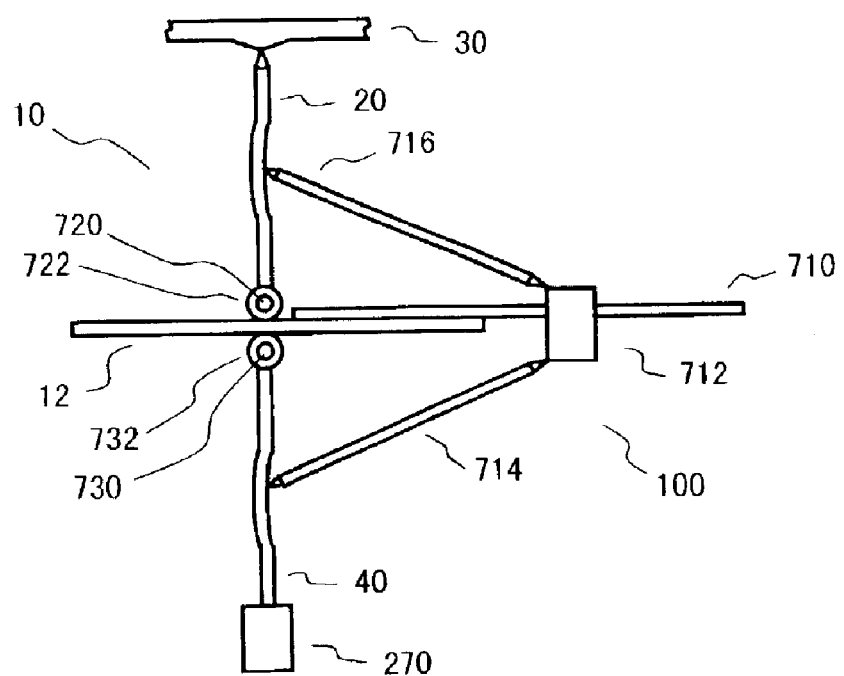
FIG. 48 is a schematic view illustrating the front of the reflector unit illustrated in FIG. 47.

FIG. 47 is a schematic view illustrating an example of the reflector unit which is loaded on a solar radiation reflecting apparatus according to still another embodiment of the present invention. FIG. 48 is a schematic view illustrating the front of the reflector unit illustrated in FIG. 47.

The reflector unit 10 includes a reflector 12, an arm 20, a reflective direction directing member 40, and a driven mechanism 100.

The driven mechanism 100 includes a guide member 710, a sliding member 712 which is slid along the guide member 710, a first connection member 714, a second connection member 716 which has the same length as the first connection member 714, and a pair of sub bars 720 and 730.

The arm 20 is tightly connected to the sub bar 720 so that the extension direction of the arm 20 is perpendicular to the extension direction of the sub bar 720. The sub bar 720 is mounted to a pair of joints 722. The pair of joints 722 are tightly fixed to the reflector 12, respectively.

With a similar connection form as the above-mentioned arm 20, the reflective direction directing member 40 is tightly connected to the sub bar 730. A pair of joints 732 which mount the sub bar 730 are tightly fixed to the reflector 12 so as to be disposed opposite the pair of joints 722.

The point of intersection between the extension line of the first connection member 714 and the extension line of the second connection member is on a plane which pass through the reflector 12 and which is parallel to a reflective surface of the reflector.

Figure 49:
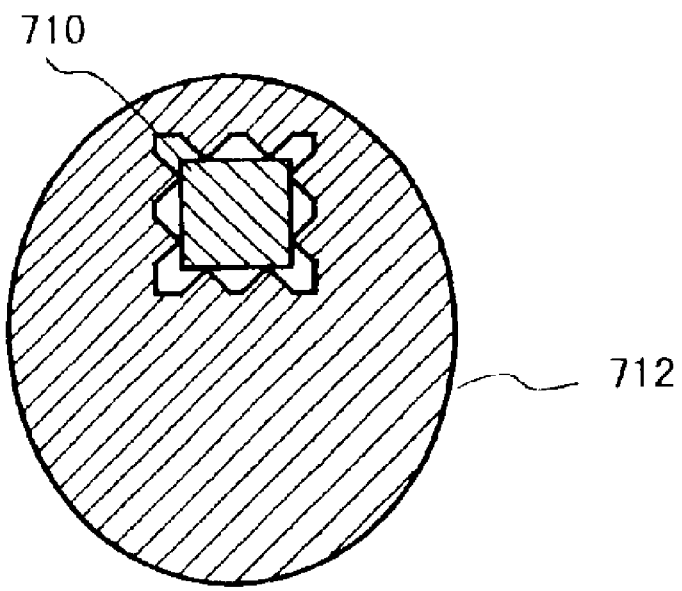
FIG. 49 is a sectional view illustrating an engagement relationship between a pivot bar and a sliding member illustrated in FIG. 47.

FIG. 49 is a sectional view illustrating the engagement relationship of the guide member 710 with the sliding member 712 illustrated in FIG. 47. The guide member 710 has a square sectional configuration. The guide member 710 is brought into contact with the sliding member 712 with the form of point contact. A spring (not shown) may be provided for impressing a prescribed pressure at the contact portions between the guide member and the sliding member. Such a structure contributes to improvement of the operational stability in an environment in which sand and dust adhere easily.

Figure 50:
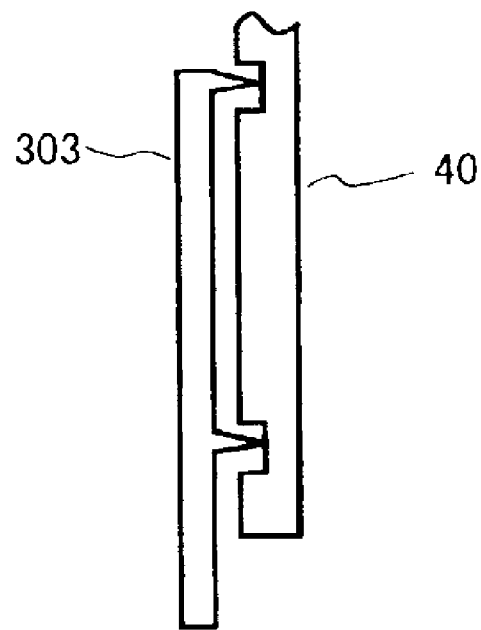
FIG. 50 is a schematic view illustrating another example of a fixing from of the reflective direction directing member.

FIG. 50 is a schematic view illustrating another example of the fixing form of the reflective direction directing member according to the present invention. The reflective direction directing member 40 and a reflective direction directing member fixing member 303 are connected through two points of universal joints. The two points of universal joints direct a prescribed reflective direction. The reflective direction directing member 40 is thereby capable of freely rotating around the reflective direction as the rotational axis. Such a structure contributes to improvement of the durability against the adhesion of sand and dust.

In the above, the solar radiation reflecting apparatus and the solar energy system according to the present invention are explained in detail. Further, the present invention may be reduced into practice with a supplemental means for preferably operating the solar radiation reflecting apparatus and the solar energy system according to the present invention, for example, a Fresnel concave lens for converting a converging light beam reflected by the solar radiation reflecting apparatus into parallel light beam, a spectral element, means for adjusting an amount of reflected light, heat accumulator, a heat conducting member, a heat insulating member, temperature controlling means, a light power meter, a means for adjusting an angle of the reflective direction directing member for adjusting a condensing ratio, an information storage medium which stores data on the track of the sun in the installation place, an operational processor, an encoder for data on the position of the common link, a digital controller for controlling a driving apparatus, a flow passage for heat transmitting fluid, a hot air heater which is supplied with the heat transmitting fluid, a supplemental heating means in response to the insufficiency of solar radiation, a light-shielding means for an emergency, a light-shielding means for adjusting power, and/or a mechanical system which imitates the track of the sun.

Accordingly, the present invention disclosed herein provides a novel solar radiation reflecting apparatus and a solar energy system, wherein in view of the teachings disclosed in the above-mentioned detailed explanation, a practice of the present invention is not limited to the above-mentioned examples for explaining the best mode the present invention, and wherein the present invention may be practiced as other embodiments with variations within the scope of the claims as follows or may be practiced without supplementary forms or elements which are appended for explaining the best mode of embodiments.

INDUSTRIAL APPLICABILITY

By the solar radiation reflecting apparatus and the solar energy system according to the present invention, a novel solar energy system with a solar radiation concentrating apparatus, a solar illuminator, a photovoltaic power generation system, a solar cooker, a solar heat system, a distillation device, a heat engine, a sunlight illuminating system, a solar furnace, and so forth is realized.

What is claimed is:

1. A solar radiation reflecting apparatus comprising:
   a plurality of arms which are disposed parallel to each other;
   a plurality of driven mechanisms which are respectively driven by the plurality of arms;
   a plurality of reflectors which are respectively rotated by the plurality of driven mechanisms;
   a plurality of reflective direction directing members which direct respective prescribed reflective directions for the plurality of reflectors and which are respectively connected to the plurality of driven mechanisms;
   a common link for simultaneously rotating the plurality of arms; and
   a driving mechanism for driving the common link so that the plurality of arms are caused to be parallel to an incident direction of a solar radiation, wherein the plurality of driven mechanisms which are simultaneously driven by the driving mechanism through the common link and the plurality of arms respectively rotate the plurality of reflectors so that the plurality of reflectors reflect the solar radiation toward the respective prescribed reflective directions, wherein at least one of the plurality of driven mechanisms includes a first guide member and a second guide member, and wherein the corresponding reflector is disposed parallel to a plane including the first guide member and the second guide member.

2. The solar radiation reflecting apparatus according to claim 1, wherein at least one of the plurality of arms is connected to the corresponding reflective direction directing member through a joint, and wherein the joint is a fulcrum for rotating the arm.

3. The solar radiation reflecting apparatus according to claim 1, wherein the driving mechanism includes a driving bar for driving the common link.

4. The solar radiation reflecting apparatus according to claim 3, further comprising a handle for rotating the driving bar.

5. The solar radiation reflecting apparatus according to claim 1, wherein the driving mechanism includes a tracking mechanism.

6. The solar radiation reflecting apparatus according to claim 5, wherein the tracking mechanism includes an optical sensor.

7. The solar radiation reflecting apparatus according to claim 1, further comprising a housing container for housing the plurality of reflectors, the plurality of driven mechanisms, the plurality of arms, and the common link.

8. The solar radiation reflecting apparatus according to claim 7, wherein a liquid is charged into the housing container.

9. The solar radiation reflecting apparatus according to claim 1, wherein the solar radiation reflected by the plurality of reflectors is concentrated to a solar radiation collecting region.

10. The solar radiation reflecting apparatus according to claim 9, wherein the solar radiation collecting region is plural.

11. The solar radiation reflecting apparatus according to claim 1, further comprising an adjusting mechanism for adjusting the prescribed reflective direction.

12. The solar radiation reflecting apparatus according to claim 1, wherein at least one of the plurality of reflective direction directing members is fixed by a fixing member having a pair of universal joints.

13. A solar energy system comprising:
   a solar energy conversion apparatus;
   a plurality of arms which are disposed parallel to each other;
   a plurality of driven mechanisms which are respectively driven by the plurality of arms;
   a plurality of reflectors which are respectively rotated by the plurality of driven mechanisms;
   a plurality of reflective direction directing members which direct respective prescribed reflective directions for the plurality of reflectors and which are respectively connected to the plurality of driven mechanisms;
   a common link for simultaneously rotating the plurality of arms; and
   a driving mechanism for driving the common link so that the plurality of arms are caused to be parallel to an incident direction of a solar radiation, wherein the plurality of driven mechanisms which are simultaneously driven by the driving mechanism through the common link and the plurality of arms respectively rotate the plurality of reflectors so that the plurality of reflectors reflect the solar radiation toward the solar energy conversion apparatus, wherein at least one of the plurality of driven mechanisms includes a first guide member and a second guide member, and wherein the corresponding reflector is disposed parallel to a plane including the first guide member and the second guide member.

14. The solar energy system according to claim 13, wherein the at least one of the plurality of driven mechanisms further includes a first sliding member mounted to the first guide member, a second sliding member which is mounted to the second guide member, a first connection member which connects the first sliding member to the corresponding reflective direction directing member, a second connection member which connects the first sliding member to the corresponding arm, a third connection member which connects the second sliding member to the reflective direction directing member, and a fourth connection member which connects the second sliding member to the arm.

15. The solar energy system according to claim 13, wherein the at least one of the plurality of driven mechanisms includes a first driven unit having the first guide member, the second guide member, a first connection member, a second connection member, a first sliding member, a second sliding member, a first base, a second base, and a third base and a second driven unit having a third guide member, a fourth guide member, a third connection member, a fourth connection member, a third sliding member, a fourth sliding member, a fourth base, a fifth base, and a sixth base.

16. The solar energy system according to claim 13, further comprising an adjusting mechanism for adjusting the prescribed reflective direction.

17. A solar radiation reflecting apparatus, comprising:
a plurality of arms which are disposed parallel to each other;
a plurality of reflectors;
a plurality of reflective direction directing members which direct respective prescribed reflective direction for the plurality of reflectors;
means for simultaneously driving the plurality of arms so that the plurality of arms are caused to be parallel to an incident direction of a solar radiation; and
means for simultaneously rotating the plurality of reflectors in accordance with respective positions of the plurality of reflective direction directing members and respective positions of the plurality of arms so that the plurality of reflectors reflect the solar radiation toward the respective prescribed reflective directions.

18. A solar radiation reflecting apparatus comprising:
a plurality of arms which are disposed parallel to each other;
a plurality of driven mechanisms which are respectively driven by the plurality of arms;
a plurality of reflectors which are respectively rotated by the plurality of driven mechanisms;
a plurality of reflective direction directing members which direct respective prescribed reflective directions for the plurality of reflectors and which are respectively connected to the plurality of driven mechanisms;
a common link for simultaneously rotating the plurality of arms; and
a driving mechanism for driving the common link so that the plurality of arms are caused to be parallel to an incident direction of a solar radiation, wherein the plurality of driven mechanisms which are simultaneously driven by the driving mechanism through the common link and the plurality of arms respectively rotate the plurality of reflectors so that the plurality of reflectors reflect the solar radiation toward the respective prescribed reflective directions, and wherein at least one of the plurality of driven mechanisms includes a first guide member, a first sliding member which is mounted to the first guide member, a second guide member, a second sliding member which is mounted to the second guide member, a first connection member which connects the first sliding member to the corresponding reflective direction directing member, a second connection member which connects the first sliding member to the corresponding arm, a third connection member which connects the second sliding member to the reflective direction directing member, and a fourth connection member which connects the second sliding member to the arm, and wherein the corresponding reflector is disposed parallel to a plane including the first guide member and the second guide member.

19. A solar radiation reflecting apparatus comprising:
a plurality of arms which are disposed parallel to each other;
a plurality of driven mechanisms which are respectively driven by the plurality of arms;
a plurality of reflectors which are respectively rotated by the plurality of driven mechanisms;
a plurality of reflective direction directing members which direct respective prescribed reflective directions for the plurality of reflectors and which are respectively connected to the plurality of driven mechanisms;
a common link for simultaneously rotating the plurality of arms; and
a driving mechanism for driving the common link so that the plurality of arms are caused to be parallel to an incident direction of a solar radiation, wherein the plurality of driven mechanisms which are simultaneously driven by the driving mechanism through the common link and the plurality of arms respectively rotate the plurality of reflectors so that the plurality of reflectors reflect the solar radiation toward the respective prescribed reflective directions, and wherein at least one of the plurality of driven mechanisms includes a first driven unit having a first guide member, a second guide member, a first connection member, a second connection member, a first sliding member, a second sliding member, a first base, a second base, and a third base and a second driven unit having a third guide member, a fourth guide member, a third connection member, a fourth guide member, a third sliding member, a fourth sliding member, a fourth base, a fifth base, and a sixth base.

20. A solar radiation reflecting apparatus comprising:
a plurality of arms which are disposed parallel to each other;
a plurality of driven mechanisms which are respectively driven by the plurality of arms;
a plurality of reflectors which are respectively rotated by the plurality of driven mechanisms;
a plurality of reflective direction directing members which direct respective prescribed reflective directions for the plurality of reflectors and which are respectively connected to the plurality of driven mechanisms;
a common link for simultaneously rotating the plurality of arms; and
a driving mechanism for driving the common link so that the plurality of arms are caused to be parallel to an incident direction of a solar radiation, wherein the plurality of driven mechanisms which are simultaneously driven by the driving mechanism through the common link and the plurality of arms respectively rotate the plurality of reflectors so that the plurality of reflectors reflect the solar radiation toward the respective prescribed reflective directions, and wherein at least one of the plurality of driven mechanisms includes a sub bar which is disposed parallel to a reflective surface of the corresponding reflector, a first pivot axis providing member which is disposed between the sub bar and the corresponding arm, a second pivot axis providing member which is disposed between the sub bar and the corresponding reflective direction directing member, a guide member which is disposed parallel to the reflective surface, a sliding member which is mounted to the guide member, a first connection member which connects the reflective direction directing member to the sliding member, and a second connection member which connects the arm to the sliding member.

21. The solar radiation reflecting apparatus according to claim 20, wherein a rotational restitutive force for maintaining the reflective direction directing member at a prescribed angle is applied when the arm becomes parallel to the reflective direction directing member.

22. A solar radiation reflecting apparatus comprising:
a plurality of arms which are disposed parallel to each other;
a plurality of driven mechanisms which are respectively driven by the plurality of arms;
a plurality of reflectors which are respectively rotated by the plurality of driven mechanisms;
a plurality of reflective direction directing members which direct respective prescribed reflective directions for the plurality of reflectors and which are respectively connected to the plurality of driven mechanisms;
a common link for simultaneously rotating the plurality of arms; and
a driving mechanism for driving the common link so that the plurality of arms are caused to be parallel to an incident direction of a solar radiation, wherein the plurality of driven mechanisms which are simultaneously driven by the driving mechanism through the common link and the plurality of arms respectively rotate the plurality of reflectors so that the plurality of reflectors reflect the solar radiation toward the respective prescribed reflective directions, and wherein at least one of the plurality of driven mechanisms includes a first sub bar which is disposed on a surface of the corresponding reflector and which is tightly connected to the corresponding arm, a second sub bar which is disposed on a rear surface of the reflector parallel to the first sub bar and which is tightly connected to the corresponding reflective direction directing member, a first pivot axis providing member which accommodates the first sub bar, a second pivot axis providing member which accommodates the second sub bar, a guide member which is tightly connected to the reflector, a sliding member which is mounted to the guide member, a first connection member which connects the reflective direction directing member to the sliding member, and a second connection member which connects the arm to the sliding member.

23. The solar radiation reflecting apparatus according to claim 22, wherein a rotational restitutive force for maintaining the reflective direction directing member at a prescribed angle is applied when the arm becomes parallel to the reflective direction directing member.

24. A solar radiation reflecting apparatus comprising:
a plurality of arms which are disposed parallel to each other;
a plurality of driven mechanisms which are respectively driven by the plurality of arms;
a plurality of reflectors which are respectively rotated by the plurality of driven mechanisms;
a plurality of reflective direction directing members which direct respective prescribed reflective directions for the plurality of reflectors and which are respectively connected to the plurality of driven mechanisms;
a common link for simultaneously rotating the plurality of arms; and
a driving mechanism for driving the common link so that the plurality of arms are caused to be parallel to an incident direction of a solar radiation, wherein the plurality of driven mechanisms which are simultaneously driven by the driving mechanism through the common link and the plurality of arms respectively rotate the plurality of reflectors so that the plurality of reflectors reflect the solar radiation toward the respective prescribed reflective directions, and wherein at least one of the plurality of driven mechanisms includes a reflector vertical bar which is tightly connected to the corresponding reflector, a first pivot bar which is connected to the corresponding reflective direction directing member, a sliding member which is connected to the first pivot bar, and a second pivot bar which is connected to the sliding member and the arm.

25. A solar energy system comprising:
a solar energy conversion apparatus;
a plurality of arms which are disposed parallel to each other;
a plurality of driven mechanisms which are respectively driven by the plurality of arms;
a plurality of reflectors which are respectively rotated by the plurality of driven mechanisms;
a plurality of reflective direction directing members which direct respective prescribed reflective directions for the plurality of reflectors and which are respectively connected to the plurality of driven mechanisms;
a common link for simultaneously rotating the plurality of arms;
a driving mechanism for driving the common link so that the plurality of arms are caused to be parallel to an incident direction of a solar radiation, wherein the plurality of driven mechanisms which are simultaneously driven by the driving mechanism through the common link and the plurality of arms respectively rotate the plurality of reflectors so that the plurality of reflectors reflect the solar radiation toward the solar energy conversion apparatus; and
an adjusting mechanism for adjusting the prescribed reflective direction, wherein a condensing ratio of the solar radiation with which the solar energy conversion apparatus is irradiated is varied, in response to a variation of an intensity of the solar radiation.

* * * * *